(12) United States Patent
Dai et al.

(10) Patent No.: US 12,104,968 B2
(45) Date of Patent: Oct. 1, 2024

(54) FLEXIBLE CAPACITOR ARRAY AND PREPARATION METHOD THEREFOR, CAPACITOR ARRAY DETECTION SYSTEM, AND ROBOT

(71) Applicant: Tencent Technology (Shenzhen) Company Limited, Shenzhen (CN)

(72) Inventors: Yuan Dai, Shenzhen (CN); Kewei Xie, Shenzhen (CN); Chuanfei Guo, Shenzhen (CN); Ningning Bai, Shenzhen (CN); Ruirui Zhang, Shenzhen (CN); Qinqin Zhou, Shenzhen (CN); Zhengyou Zhang, Shenzhen (CN)

(73) Assignee: Tencent Technology (Shenzhen) Company Limited, Shenzhen (CN)

( * ) Notice: Subject to any disclaimer, the term of this patent is extended or adjusted under 35 U.S.C. 154(b) by 322 days.

(21) Appl. No.: 17/702,275

(22) Filed: Mar. 23, 2022

(65) Prior Publication Data
US 2022/0214233 A1    Jul. 7, 2022

Related U.S. Application Data

(63) Continuation of application No. PCT/CN2021/086979, filed on Apr. 10, 2021.

(30) Foreign Application Priority Data

May 7, 2020    (CN) .......................... 202010377743.6

(51) Int. Cl.
*G01R 27/26*    (2006.01)
*B25J 9/16*    (2006.01)
(Continued)

(52) U.S. Cl.
CPC .............. *G01L 1/146* (2013.01); *B25J 9/1633* (2013.01); *B25J 9/1664* (2013.01); *B25J 13/085* (2013.01);
(Continued)

(58) Field of Classification Search
CPC ...... G01L 1/146; G01L 5/0052; B25J 9/1633; B25J 9/1664; B25J 13/085; G01R 27/2605
See application file for complete search history.

(56) References Cited

U.S. PATENT DOCUMENTS 5,151,859 A      9/1992  Yoshino et al.
7,422,921 B2 *   9/2008  Hsu ..................... H01G 4/1209
                                                        438/89
(Continued)

FOREIGN PATENT DOCUMENTS

CN    101414190 A    4/2009
CN    102589759 A    7/2012
(Continued)

OTHER PUBLICATIONS

Japanese Notification of Reasons for Refusal issued Jul. 5, 2023 in corresponding Japanese Patent Application No. 2022-539324 with English translation.
(Continued)

*Primary Examiner* — Jermele M Hollington
*Assistant Examiner* — Taqi R Nasir
(74) *Attorney, Agent, or Firm* — Crowell & Moring LLP

(57) ABSTRACT

This disclosure provides a flexible capacitor array and a preparation method therefor, a capacitor array detection system, and a robot. The flexible capacitor array includes: a first flexible electrode layer including a first electrode array; a second flexible electrode layer including a second electrode array arranged opposite to the first electrode array; and
(Continued)

a spacer layer and a dielectric layer, the spacer layer and the dielectric layer being arranged between each electrode pair arranged opposite in the first electrode array and the second electrode array. A unit capacitor in the flexible capacitor array includes the electrode pair, the spacer layer, and the dielectric layer.

20 Claims, 12 Drawing Sheets

(51) Int. Cl.
    *B25J 13/08*     (2006.01)
    *G01L 1/14*     (2006.01)
    *G01L 5/00*     (2006.01)

(52) U.S. Cl.
    CPC ........ *G01L 5/0052* (2013.01); *G01R 27/2605* (2013.01)

(56) References Cited

U.S. PATENT DOCUMENTS

| | | | |
|---|---|---|---|
| 2002/0078757 A1 | | 6/2002 | Hines et al. |
| 2004/0255681 A1 | | 12/2004 | Cook et al. |
| 2009/0033341 A1 | | 2/2009 | Son et al. |
| 2016/0293337 A1 | * | 10/2016 | Sugawara ................ H01G 9/15 |
| 2017/0059434 A1 | | 3/2017 | Li et al. |

FOREIGN PATENT DOCUMENTS

| | | | | |
|---|---|---|---|---|
| CN | 103631463 A | | 3/2014 | |
| CN | 106706176 A | | 5/2017 | |
| CN | 107655498 A | | 2/2018 | |
| CN | 111504521 A | | 8/2020 | |
| DE | 102015218891 A1 | * | 3/2017 | ............... G01B 7/22 |
| FR | 3001800 A1 | * | 8/2014 | ............ G01L 1/146 |
| JP | 2019-067125 | | 4/2019 | |
| WO | WO2009/096419 | | 8/2009 | |

OTHER PUBLICATIONS

International Search Report and Written Opinion with English Translation for International Application No. PCT/CN2021/086979 dated Jul. 21, 2021, 14 pages.
Chinese Office Action for Chinese Patent Application No. 202010377743.6 dated Feb. 3, 2021, 14 pages.
EESR issued on European Application 21800573.4 on Nov. 25, 2022, 10 pages.
European office action issued in European application No. 21800573.4, dated May 6, 2024, 10 pages.
Nie et al., "Flexible Transparent Iontronic Film for Interfacial Capacitive Pressure Sensing," Advanced Materials, Oct. 2015, 27:6055-6062.

* cited by examiner

FLEXIBLE CAPACITOR ARRAY AND PREPARATION METHOD THEREFOR, CAPACITOR ARRAY DETECTION SYSTEM, AND ROBOT

RELATED APPLICATION

This application a continuation application of PCT Patent Application No. PCT/CN2021/086979, filed on Apr. 10, 2021, which claim priority to Chinese Patent Application No. 202010377743.6, entitled "FLEXIBLE CAPACITOR ARRAY AND PREPARATION METHOD THEREFOR, CAPACITOR ARRAY DETECTION SYSTEM, AND ROBOT", filed with the China Intellectual Property Administration on May 7, 2020, wherein the content of each of the above-referenced applications is incorporated herein by reference in its entirety.

FIELD OF THE TECHNOLOGY

This application relates to a flexible capacitor array and a preparation method therefor, a capacitor array detection system, and a robot.

BACKGROUND OF THE DISCLOSURE

With the development of intelligent robot technologies and the deepening of robot application scenarios, people hope that a robot can not only complete a set mechanical movement, but also perceive an external environment and give a feedback.

Currently, a mechanical sensor used in the robot is usually a multi-axis force sensor. The applicant of this application finds that the multi-axis force sensors are mostly rigid, and have relatively large volumes. Although a flexible sensor in the related art can be miniaturized, the pressure the flexible sensor can measure is relatively small, which is not suitable for an application under ultra-high pressure such as robot movement detection. At the same time, the stability of the flexible sensor in the related art is insufficient to accurately measure the pressure in the robot movement. Therefore, it is difficult to measure the force on a foot end of the robot and the standing stability of the robot through the sensor in the related art. Consequently, it is difficult to design and develop stable gait walking, running, and jumping of the robot.

SUMMARY

At least one embodiment of this disclosure provides a flexible capacitor array, including: a first flexible electrode layer, including a first electrode array; a second flexible electrode layer, the second flexible electrode layer including a second electrode array; a dielectric layer, the dielectric layer being arranged between the first flexible electrode layer and the second flexible electrode layer; and a first spacer layer, arranged between the first electrode array and the dielectric layer, each electrode pair arranged opposite in the first electrode array and the second electrode array, and portions of the first spacer layer and the dielectric layer between the electrode pair forming a unit capacitor of the flexible capacitor array, the unit capacitor including a first double electric layer capacitor, the first double electric layer capacitor including the first electrode, the first spacer layer, and the dielectric layer; and in a pressed state, the dielectric layer in the unit capacitor passing through the first spacer layer to come into contact with the first electrode to form at least one first contact surface, a first micro double electric layer capacitor being formed at each of the at least one contact surface, and at least one first micro double electric layer capacitor at the at least one contact surface being connected in parallel to form the first double electric layer capacitor.

At least one embodiment of this disclosure further provides a preparation method for a flexible capacitor array, including: providing a first flexible electrode layer, the first flexible electrode layer including a first electrode array; providing a first spacer layer, and placing the first spacer layer on the first flexible electrode layer; providing a dielectric layer, and placing the dielectric layer on the first spacer layer; providing a second flexible electrode layer, the second flexible electrode layer including a second electrode array; placing the second flexible electrode layer on the dielectric layer; and encapsulating the first flexible electrode layer, the dielectric layer, the spacer layer, and the second flexible electrode layer into the flexible capacitor array, each electrode pair arranged opposite in the first electrode array and the second electrode array, and portions of the first spacer layer and the dielectric layer between the electrode pair forming a unit capacitor of the flexible capacitor array, the unit capacitor including a first double electric layer capacitor, the first double electric layer capacitor including the first electrode, the first spacer layer, and the dielectric layer; and in a pressed state, the dielectric layer in the unit capacitor passing through the first spacer layer to come into contact with the first electrode to form at least one first contact surface, a first micro double electric layer capacitor being formed at each of the at least one contact surface, and at least one first micro double electric layer capacitor at the at least one contact surface being connected in parallel to form the first double electric layer capacitor.

At least one embodiment of this disclosure further provides a capacitor array detection system, including: the foregoing flexible capacitor array; a capacitor selection circuit, configured to gate at least one unit capacitor in the flexible capacitor array; an excitation circuit, configured to output an excitation signal to the first electrode array of the flexible capacitor array and the second electrode array of the flexible capacitor array under control of the capacitor selection circuit; and a capacitor detection circuit, configured to detect a capacitor value of the at least one unit capacitor.

At least one embodiment of this disclosure further provides a robot that may perform movement balance control of the robot based on a result of a capacitor array detection system. The robot includes: the foregoing capacitor array detection system, a flexible capacitor array in the capacitor array detection system being arranged on at least one portion of a pressure sensing detection surface of the robot; an impact force detector, configured to calculate an impact force detection value and an impact force occurrence position according to a capacitor value of at least one unit capacitor detected by the capacitor array detection system; an impact disturbance determiner, configured to determine whether an impact disturbance occurs based on the impact force detection value and the impact force occurrence position calculated by the impact force detector; and an anti-impact disturbance controller, configured to, in response to the determined impact disturbance, adjust an operation parameter of the robot and control the robot to resist the impact disturbance.

One or more embodiments of this disclosure provide a flexible capacitor array and a preparation method therefor, a capacitor array detection system, and a robot, to implement flexibility, high sensing density, and high sensing sensitivity of a mechanical sensing system in combination with the flexible electrode layer and the dielectric layer, and increase the stability of the sensor through the spacer layer, so that the flexible capacitor array as a whole presents flexibility and sensitivity, stability and a capability to withstand high pressure of a pressure sensing system are greatly improved.

BRIEF DESCRIPTION OF THE DRAWINGS

To describe the technical solutions in the embodiments of this disclosure more clearly, the following briefly describes the accompanying drawings of the embodiments. Apparently, the accompanying drawings in the following description show merely some embodiments of this disclosure, and are not intended to limit this disclosure.

DESCRIPTION OF EMBODIMENTS

To make the objectives, technical solutions, and advantages of the embodiments of this disclosure more comprehensible, the following clearly and completely describes the technical solutions in the embodiments of this disclosure with reference to the accompanying drawings. Apparently, the described embodiments are a part rather than all of the embodiments of this disclosure. All other embodiments obtained by a person of ordinary skill in the art based on the embodiments of this disclosure without creative efforts shall fall within the protection scope of this disclosure.

Unless otherwise defined, a technical term or a scientific term used in this disclosure is to have a general meaning understood by a person of ordinary skill in the art of this disclosure. The "first", the "second", and similar terms used in this disclosure do not indicate any order, quantity or significance, but are used to only distinguish different components. Similarly, "one", "a", "the", and similar terms also do not indicate a quantity limitation, but indicates that there is at least one. A similar term such as "include" or "comprise" means that an element or an item appearing in front of the term covers an element or an item and equivalents thereof listed behind the term, but does not exclude another element or item. A similar term such as "connect" or "connection" is not limited to a physical or mechanical connection, but may include an electrical connection, whether direct or indirect. "Up", "down", "left", "right", and the like are merely used for indicating relative positional relationships. When absolute positions of described objects change, the relative positional relationships may correspondingly change.

The following describes the embodiments of this disclosure and examples thereof in detail with reference to the accompanying drawings.

Figure 1:
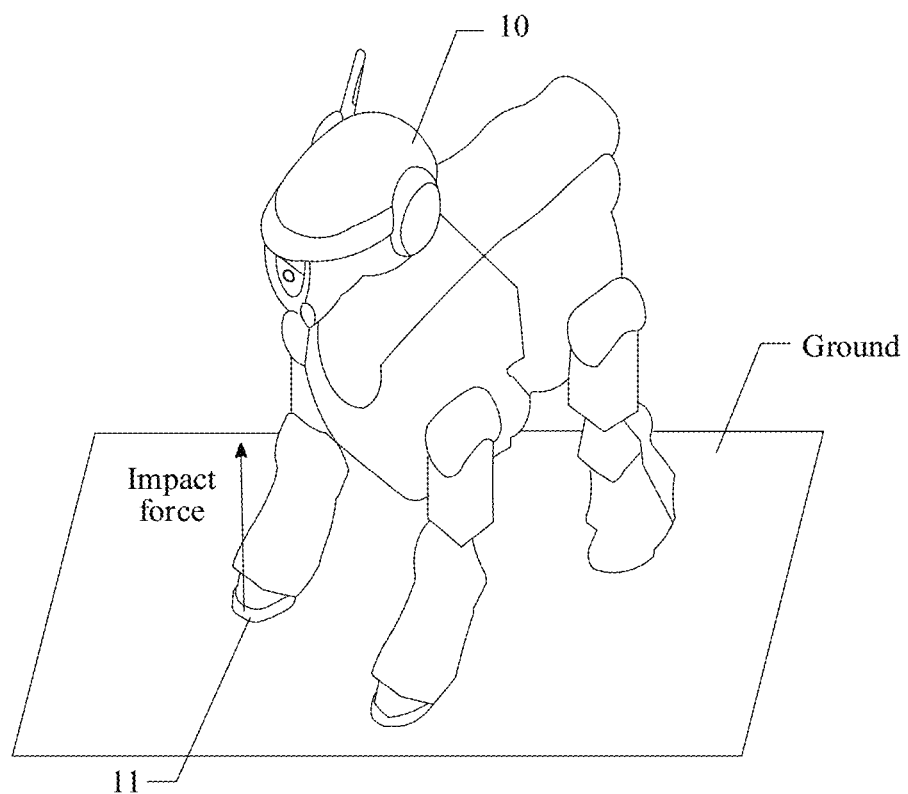
FIG. 1 is a schematic diagram of an intelligent quadruped robot.

FIG. 1 is a schematic diagram of an intelligent quadruped robot 10. Referring to FIG. 1, in an actual environment, to enable the intelligent quadruped robot 10 to assist or replace human beings to execute a monotonous repetitive or high-risk task, the intelligent quadruped robot 10 needs to have a stable movement capability. Therefore, the intelligent quadruped robot 10 needs to be capable of detecting a magnitude and a direction of an impact force applied by the ground to a sole of a foot during the movement. Therefore, a mechanical sensor is disposed on a detection surface of the sole of the foot of the intelligent quadruped robot 10, so that the intelligent quadruped robot 10 can determine how to perform balance and stability control according to the impact force.

The intelligent quadruped robot 10 may be based on artificial intelligence (AI). AI is a theory, method, technology, and application system in which a digital computer or a machine controlled by a digital computer is used for simulating, extending, and expanding human intelligence, sensing an environment, acquiring knowledge, and using the knowledge to obtain an optimal result. In other words, AI is a comprehensive technology of computer science, which attempts to understand the essence of intelligence and produce a new type of intelligent machine that can react in a similar way to human intelligence. AI is to study design principles and implementation methods of various intelligent machines, so that the machines have the functions of perception, reasoning, and decision-making. The AI technology is a comprehensive discipline, covering a wide range of fields including both hardware-level technologies and software-level technologies. The sensor may be used as one of basic technologies of AI.

A mechanical sensor used by the intelligent quadruped robot 10 in the related art is usually a multi-axis force sensor. The mechanical sensors are mostly rigid, and have relatively large volumes. Therefore, mounting of a rigid mechanical sensor is not suitable for a quadruped robot with a small plantar area. Although a flexible sensor in the related art can be miniaturized, the pressure the flexible sensor can measure is relatively small, which is not suitable for an application under ultra-high pressure such as quadruped robot movement detection. At the same time, the stability of the flexible sensor in the related art is insufficient to accurately measure the pressure in the robot movement.

In view of this, the embodiments of this disclosure provide a flexible capacitor array with a rapid response speed, high precision, a large range, and strong impact resistance. For example, the flexible capacitor array may be used as a mechanical sensor of the sole of the foot of the intelligent quadruped robot 10 shown in FIG. 1. The flexible capacitor array can accurately detect the magnitude and the direction of the impact force on the sole of the foot of the intelligent quadruped robot 10. On one hand, the intelligent quadruped robot 10 can calculate a zero torque point (ZMP) of the robot based on the impact force, as a basis for determining whether the robot losses stability and whether balance control is needed. On the other hand, the intelligent quadruped robot 10 can construct a whole-body dynamic balance controller based on this force, and input the measured impact force as an external force, to calculate a torque or angle compensation amount of each joint to keep balance under the impact force. At the same time, the intelligent quadruped robot 10 can further design a sole shock absorption controller based on the impact force, and adjust an interaction force between the foot and the ground according to an error between the force detected by the flexible capacitor array and a pre-planned plantar force. As a result, a swinging foot lands more smoothly, the landing impact is reduced, and a support foot is as close to the ground as possible, to improve the movement stability of the quadruped robot. The flexible capacitor array in the embodiments of this disclosure is arranged in an array and therefore can be rapidly mounted without changing a mechanical structure of the sole of the foot, and is more suitable for the design of the current intelligent quadruped robot 10.

The embodiments of this disclosure further provide a capacitor array detection system, including the foregoing flexible capacitor array. The capacitor array detection system of the embodiments of this disclosure may further be used as a component of a measuring apparatus for a human walking parameter. The human walking parameter is of great significance to researches in the fields of biomedicine and bipedal robots. In the field of biomedicine, the human walking parameter is strongly related to the physical state. For example, a Parkinson's patient has unique plantar pressure distribution, and foot ulcers, a common complication of a diabetes patient, affect the walking gait of the patient. The capacitor array detection system in the embodiments of this disclosure can measure and record walking parameters of a normal person and a patient by detecting the impact force applied by the ground on the sole the foot of the persons during walking, and perform big data analysis in combination with machine learning to obtain the walking parameters under different symptoms, thereby assisting a doctor in treatment. In the field of bipedal robots, due to natural evolution of human beings for tens of millions of years, the human beings have excellent dexterity and strong environmental adaptability. The capacitor array detection system in the embodiments of this disclosure can measure the human walking parameter, and uses the walking parameter as an important basis for planning the gait of the bipedal robot, to simulate the human movement mechanism to research and develop the bipedal robot, thereby improving adaptability of the bipedal robot to complex environments.

One or more embodiments of this disclosure provide a flexible capacitor array and a preparation method therefor, a capacitor array detection system, and a robot, so that the flexible capacitor array as a whole presents flexibility and greatly improves sensitivity, stability and a capability to withstand high pressure of a pressure sensing system.

Figure 2A:
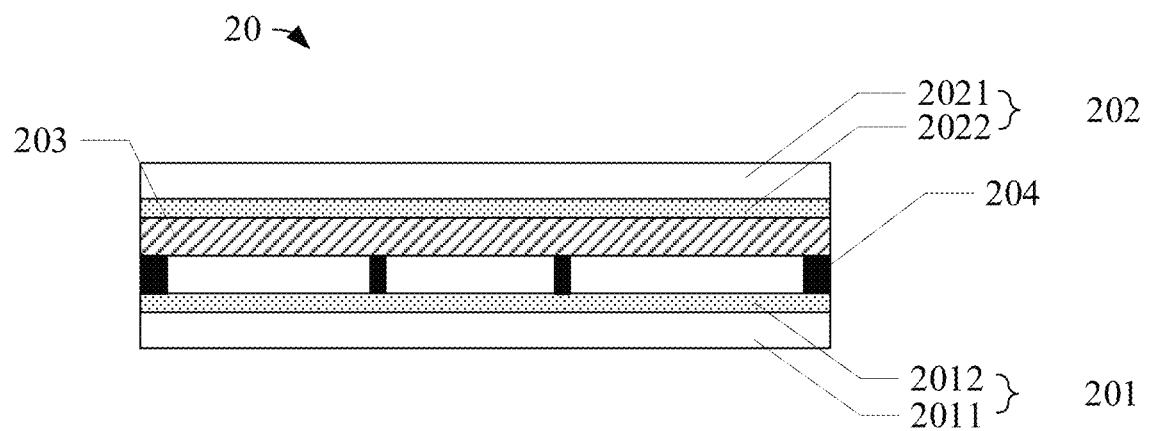
FIG. 2A is a schematic diagram of a flexible capacitor array according to an embodiment of this disclosure.
Figure 2B:
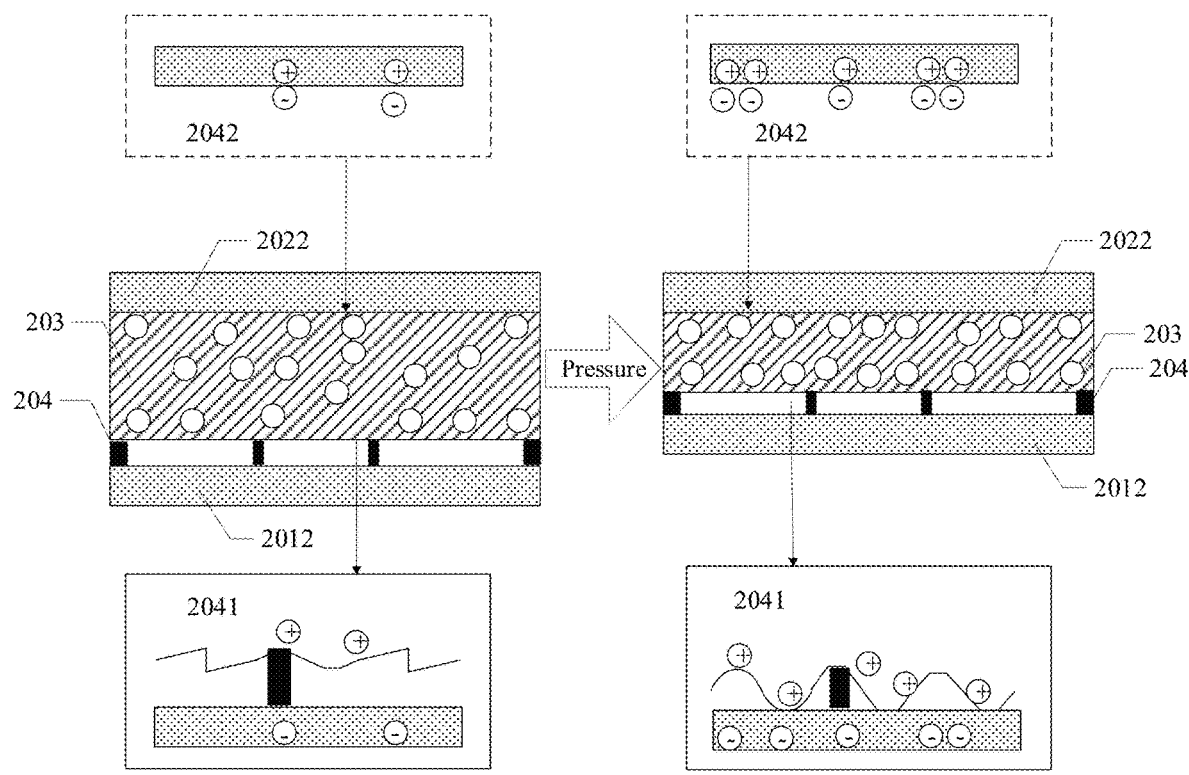
FIG. 2B is a schematic diagram of a principle of a flexible capacitor array according to an embodiment of this disclosure.
Figure 2C:
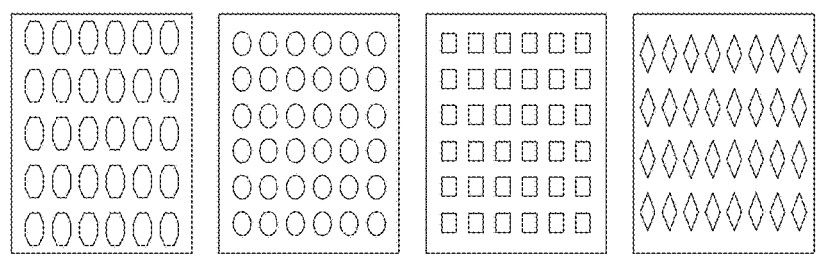
FIG. 2C is a schematic top view of a structure of a spacer layer in a flexible capacitor array according to an embodiment of this disclosure.
Figure 2D:
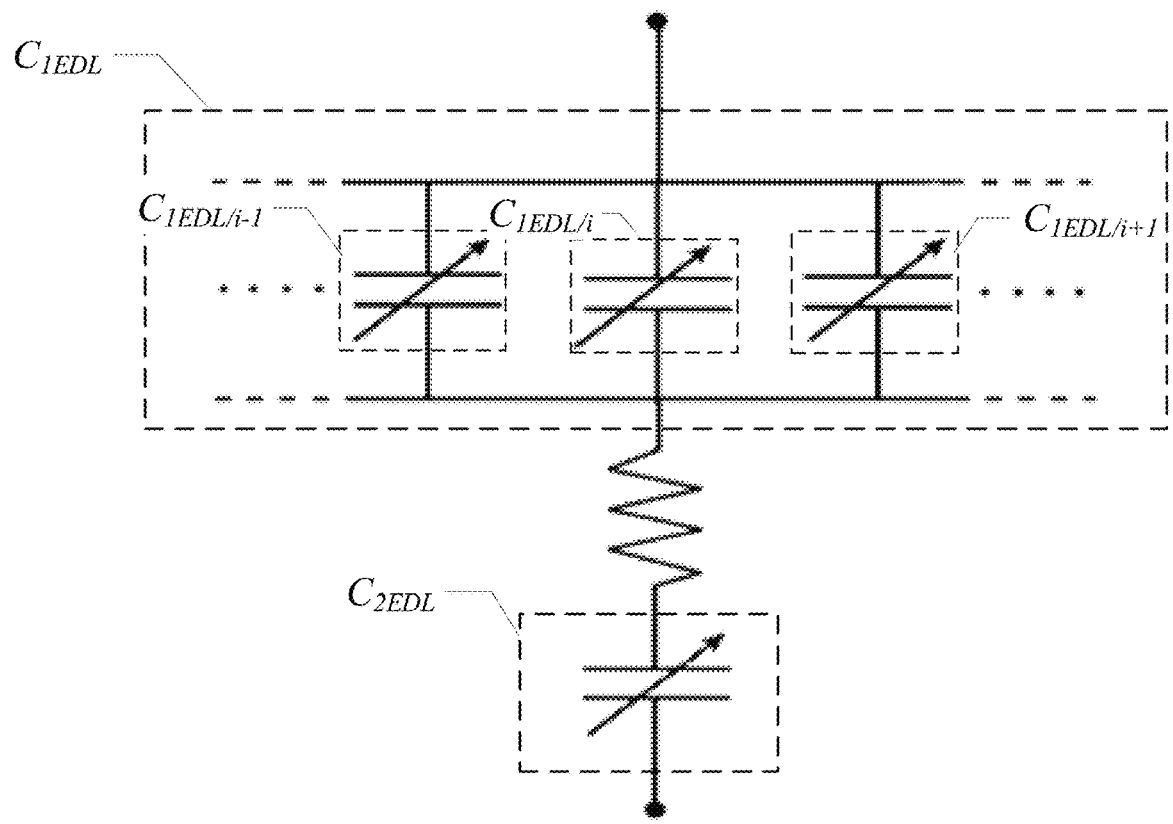
FIG. 2D is an equivalent circuit diagram of a double electric layer capacitor in a flexible capacitor array according to an embodiment of this disclosure.

FIG. 2A is a schematic diagram of a flexible capacitor array 20 according to an embodiment of this disclosure. FIG. 2B is a schematic diagram of a principle of a flexible capacitor array 20 according to an embodiment of this disclosure. FIG. 2C is a schematic top view of a structure of a first spacer layer 204 in a flexible capacitor array 20 according to an embodiment of this disclosure. FIG. 2D is an equivalent circuit diagram of a unit capacitor in a flexible capacitor array 20 according to an embodiment of this disclosure.

FIG. 2A and FIG. 2B show a structure of a unit capacitor of a flexible capacitor array 20. However, a person skill in the art is to understand that the flexible capacitor array 20 may include a plurality of unit capacitors similar in structure to the unit capacitor in FIG. 2A and FIG. 2B.

As shown in FIG. 2A, the flexible capacitor array 20 includes a first flexible electrode layer 201, a second flexible electrode layer 202, a dielectric layer 203, and a first spacer layer 204. The first flexible electrode layer 201 includes a first electrode array 2012. A plurality of first electrodes in the first electrode array 2012 are arranged into a matrix including M rows and N columns, M and N being positive integers.

The second flexible electrode layer 202 includes a second electrode array 2022. A plurality of second electrodes in the second electrode array are arranged into a matrix including M rows and N columns, and the second electrode in an $i^{th}$ row and an $j^{th}$ column in the second electrode array and the first electrode in an $i^{th}$ row and an $j^{th}$ column in the first electrode array are arranged opposite, to form the electrode pair, i being greater than or equal to 0 and being less than M, and j being greater than or equal to 0 and being less than N. The second electrode in the $i^{th}$ row and the $j^{th}$ column in the second electrode array and the first electrode in the $j^{th}$ row and the $i^{th}$ column in the first electrode array may further be arranged opposite, to form the electrode pair. Therefore, the embodiments of this disclosure are not limited to that the electrodes in the $i^{th}$ row and the $j^{th}$ column in the first electrode array and the second electrode array are arranged opposite to form the electrode pair.

For each electrode pair arranged opposite in the first electrode array 2012 and the second electrode array 2022, the first spacer layer 204 and the dielectric layer 203 are arranged between the electrode pair. One electrode pair, and the first spacer layer 204 and the dielectric layer 203 between the electrode pair forms one unit capacitor in the flexible capacitor array 20.

In some embodiments, the first spacer layer 204 includes a cavity that separates the dielectric layer 203 from at least one electrode in the electrode pair. For example, FIG. 2A is a cross-sectional view of the first spacer layer 204. The cavity in the first spacer layer 204 separates the electrode in the first electrode array 2012 from the dielectric layer 203.

In some embodiments, another spacer layer (for example, a second spacer layer) may further be designed in the electrode pair, to separate the electrode in the second electrode array 2022 from the dielectric layer 203, thereby separating the electrode in both the first electrode array 2012 and the second electrode array 2022 from the dielectric layer 203.

In some embodiments, the cavity in the first spacer layer 204 and/or the second spacer layer includes at least one of the following: a cavity formed by a polydimethylsiloxane (PDMS) support column; a cavity formed by a frame-shaped bracket of a polymer thin film; or a cavity formed by a mesh-shaped polymer thin film. The cavity formed by the frame-shaped bracket of the polymer thin film may form a bracket with a frame by cutting a middle portion of the entire polymer thin film.

FIG. 2C is a plurality of top views of the first spacer layer 204 and/or the second spacer layer. A mesh in the mesh-shaped polymer thin film may be a honeycomb-shaped mesh, a circular mesh, a square mesh, a prismatic meshes or the like shown in FIG. 2C. A person skilled in the art is to understand that, in addition to adding an air layer or an organic layer by introducing a cavity, a spacer layer may also be introduced in other manners. This is not limited in the embodiments of this disclosure.

Based on the above, an electrode layer of an ionic capacitor sensor in the related art is adjacent to the dielectric layer, causing signal drift of the sensor. Compared with the ionic capacitor sensor in the related art, the design of the first spacer layer 204 in the embodiments of this disclosure, such as an air layer or a polymer thin film layer, separates an upper electrode layer from the dielectric layer, thereby reducing the signal drift of the sensor, and increasing the stability of the sensor.

In some embodiments, the dielectric layer 203 is an ion gel thin film formed by polyvinyl alcohol-phosphoric acid (PVA-$H_3PO_4$). Compared with the ionic capacitor sensor in the related art, the dielectric layer 203 of the PVA-$H_3PO_4$ material has higher stability and sensitivity. A person skilled in the art is to understand that other materials may also be used for replacing the PVA-$H_3PO_4$ dielectric layer. For example, an ionic dielectric layer may be obtained by soaking a polymer fiber, paper or the like with ionic liquid, or ionic liquid may be used as the dielectric layer 203.

In some embodiments, a surface of the dielectric layer 203 may have a microstructure on one side and be flat on the other side. In some embodiments, one side of the dielectric layer 203 close to the second electrode array 2022 may be flat, and one side of the dielectric layer 203 close to the first spacer layer 204 may have a microstructure.

In addition, the flexible capacitor array 20 may further include another structure or functional layer as required. For example, the flexible capacitor array 20 may include a lead wire layer for implementing a function of transmitting a pressure sensing signal. In another example, the flexible capacitor array 20 may further include a protective layer, for example, the protective layer is a flexible thin film protective layer. For example, the flexible capacitor array 20 may further include other functional layers, and these functional layers may be combined on the first flexible electrode layer 201 or the second flexible electrode layer 202 through an optically transparent glue (OCA glue). Other structures of the flexible capacitor array 20 are not specifically limited in the embodiments of this disclosure.

The first flexible electrode layer 201 includes a first flexible thin film layer 2011, and the first electrode array 2012 is fabricated on the first flexible thin film layer 2011. The second flexible electrode layer 202 includes a second flexible thin film layer 2021, and the second electrode array 2022 is fabricated on the second flexible thin film layer 2021. The flexible capacitor array 20 is encapsulated with a flexible thin film material. Because all the components in the flexible capacitor array 20 are made of flexible materials, the whole flexible capacitor array 20 can be bent and stretched or deformed to some extent, and can ensure stability of mechanical sensing performance under certain deformation. When the flexible capacitor array 20 is applied to the quadruped robot, the flexible capacitor array 20 can be perfectly attached to the sole of the foot of the robot or on any position of an outer surface of the robot, causing the pressure sensing signal to be more stable and accurate. The first electrode array 2012 and the second flexible electrode layer 202 may further be large-area flexible electrode layers. Therefore, the flexible capacitor array 20 can be attached to the sole of the robot or on any position of the outer surface of the robot with the form, to implement all-round mechanical sensing of the robot.

For example, to form the flexible electrode layer, the first electrode array 2012 may be fabricated on the first flexible thin film layer 2011 by using silver nano-spraying or physical vapor deposition. Similarly, the second electrode array 2022 may also be fabricated on the second flexible thin film layer 2021 by using the silver nano-spraying or the physical vapor deposition. For example, the physical vapor deposition includes evaporation (for example, electron beam evaporation) or sputtering. The first flexible thin film layer 2011 and the second flexible thin film layer 2021 may be made of at least one of the following materials: thermoplastic polyurethane (TPU) elastomer rubber, polyethylene terephthalate (PET), polyimide (PI), polyvinylidene fluoride (PVDF), polyvinyl alcohol (PVA), nylon 6 (PA6), polylactic acid (PLA), polyacrylonitrile (PAN), and polyethersulfone (PES).

For example, a mask with a preset electrode pattern may be prepared first, and then a patterned array electrode is sprayed on PET of a flexible thin film by spraying a silver nanowire. The silver nanowire is a nanoscale wire made of silver. In addition to the excellent electrical conductivity of silver, the silver nanowire further has light transmission and flexibility due to a nanoscale size effect of the silver nanowire, thereby implementing high flexibility and electrical conductivity. Alternatively, electron beam evaporation may be used to evaporate an Au thin film on a flexible thin film (for example, PET), thereby fabricating the patterned electrode array. The electron beam evaporation is a physical vapor deposition process. The electron beam evaporation may accurately use high-energy electrons to bombard a target (for example, gold (Au)) in a crucible in cooperation with an electromagnetic field, to melt and deposit the target on a substrate (for example, the flexible thin film), thereby evaporating an electrode array with high purity and high precision. Certainly, the first electrode array 2012 and the second electrode array 2022 may further be fabricated on the flexible thin film in other manners. This is not limited in this disclosure.

Therefore, the flexible electrode layer is formed in the first flexible electrode layer 201 and the second flexible electrode layer 202.

As shown in FIG. 2B, a variable capacitor structure-first double electric layer capacitor $C_{1EDL}$ is formed among the first electrode in the first electrode array 2012, the first spacer layer 204, and the dielectric layer 203. For ease of description, the first electrode herein refers to any first electrode in the first electrode array 2012. For example, an electrode-spacer layer-dielectric layer structure 2041 is formed among the first electrode in the first electrode array 2012, the first spacer layer 204, and the dielectric layer 203 in FIG. 2B. On the electrode-spacer layer-dielectric layer structure 2041, surface charges inside the first electrode adsorb ions (for example, as white circles shown in FIG. 2B) from the dielectric layer 203. Therefore, at the electrode-spacer layer-dielectric layer interface 2041, an ionic interface layer that has the same quantity of charges as the surface charges inside the first electrode and an opposite sign is formed on one side of the electrode-spacer layer-dielectric layer interface 2041 close to the spacer layer. For example, when a negative voltage is applied to the first electrode, a negative charge layer is formed at one side of the first electrode close to the first spacer layer 204, and a cation layer is formed at one side of the dielectric layer 203 close to the first spacer layer 204. Due to the existence of the first spacer layer 204, neither cations of the cation layer nor negative charges in the negative charge layer can cross the boundary and neutralize each other. In some embodiments, the side of the dielectric layer 203 close to the first spacer layer 204 may have a microstructure. When pressure is applied to the first electrode (pressed state), an ion gel surface microstructure of the dielectric layer 203 may partially pass through the first spacer layer 204 to come into contact with the first electrode, so that the variable capacitor structure is formed at the electrode-spacer layer-dielectric layer structure 2041.

FIG. 2D is an equivalent circuit diagram of a unit capacitor in a flexible capacitor array after pressure is applied according to an embodiment of this disclosure. In a non-pressed state, a distance between the electrode-spacer layer-dielectric layer structure 2041 is relatively large. In the pressed state, due to the existence of the first spacer layer 204 and the microstructures on the side of the dielectric layer 203 close to the first electrode having different microcone heights, a distance between the first electrode and the dielectric layer 203 decreases. Moreover, a partial region in the dielectric layer 203 and the first electrode are in contact with each other, thereby forming at least one first contact surface. A first micro double electric layer capacitor is formed at each first contact surface. Referring to FIG. 2D, it is assumed that N contact surfaces are formed at the electrode-spacer layer-dielectric layer structure 2041 due to pressure, where the micro double electric layer capacitor formed by an $i^{th}$ contact surface is $C_{1EDL/i}$. In the electrode-spacer layer-dielectric layer structure 2041, the N micro double electric layer capacitors formed by N contact surfaces are in a parallel relationship. According to a capacitor parallel formula, a magnitude of the first double electric layer capacitor $C_{1EDL}$ at the electrode-spacer layer-dielectric layer structure 2041 is a sum of all micro double electric layer capacitors, that is, $C_{1EDL}=C_{1EDL/1}+C_{1EDL/2}+C_{1EDL/3}+ \ldots C_{1EDL/i-1}+C_{1EDL/i}+C_{1EDL/i+1} \ldots =\Sigma C_{1EDL/i}(1 \le i \le N)$.

In some embodiments, an electrode-dielectric layer structure (that is, a second double electric layer capacitor $C_{2EDL}$) is formed between the second electrode in the second electrode array 2022 and the dielectric layer 203. For ease of description, the second electrode herein refers to any one second electrode in the first electrode array 2022. For example, an electrode-dielectric layer structure 2042 is formed between the second electrode in the second electrode array 2022, and the dielectric layer 203 in FIG. 2B. On the electrode-dielectric layer structure 2042, surface charges inside the second electrode adsorb ions (for example, as white circles shown in FIG. 2B) from an electrolyte of the dielectric layer 203. Therefore, at the electrode-dielectric layer interface 2042, an ionic interface layer that has the same quantity of charges as the surface charges inside the first electrode and an opposite sign is formed on one side of the electrode-dielectric layer interface 2042 close to the dielectric layer. For example, when a positive voltage is applied to the second electrode, a positive charge layer is formed at one side of the electrode-dielectric layer structure 2042 close to the second electrode, and an anion layer is formed at one side of the electrode-dielectric layer structure 2042 close to the dielectric layer 203. Due to the existence of the electrode-dielectric layer structure 2042, neither positive charges of the positive charge layer nor anions on the anion layer can cross the boundary and neutralize each other. Therefore, a stable double electric layer capacitor (that is, the second double electric layer capacitor $C_{2EDL}$) is formed at the electrode-dielectric layer structure 2042. In this case, because the second electrode in the electrode-dielectric layer structure 2042 is always in contact with the dielectric layer 203, the capacitor value of the second double electric layer capacitor $C_{2EDL}$ remains unchanged.

It is assumed that a double electric layer capacitor of a magnitude $C_{2EDL}$ is formed at the electrode-dielectric layer 2042. Referring to FIG. 2D, $C_{1EDL}$ and $C_{2EDL}$ are in a series relationship. Therefore, when pressure is applied, a relationship between the capacitor value $C_{EDL}$ of the double electric layer capacitor of the unit capacitor and $C_{1EDL}$ and $C_{2EDL}$ is: $1/C_{EDL}=1/C_{1EDL}+1/C_{2EDL}$. Therefore, the magnitude of the capacitor value $C_{EDL}$ of the double electric layer capacitor of the unit capacitor is shown in formula (1):

$$C_{EDL} \times C_{1EDL} \cdot C_{2EDL}/(C_{1EDL}+C_{2EDL})=\Sigma C_{1EDL/i} \cdot C_{2EDL}/(\Sigma C_{1EDL/i}+C_{2EDL}) \quad (1)$$

Therefore, the electrode pair, and the first spacer layer 204 and the dielectric layer 203 in the middle portion of the electrode pair form one unit capacitor in the flexible capacitor array 20, and the unit capacitor is an ionic double electric layer capacitor.

In addition, an electrostatic capacitor is further formed between the first electrode and the second electrode. After the pressure is applied, because the dielectric layer and the spacer layer are extruded, a distance between the first electrode and the second electrode decreases. According to a capacitor calculation formula (2):

$$C = \frac{\varepsilon S}{4\pi k d} \quad (2)$$

C represents a capacitor value of the electrostatic capacitor of the unit capacitor, represents a dielectric constant of the material, S represents a facing area of the first electrode and the second electrode, k represents an electrostatic force constant, and d represents the distance between the first electrode and the second electrode. In the flexible capacitor array 20, the first electrode and the second electrode are placed facing each other, so that an electrostatic field of the flexible capacitor array 20 may be approximated as a parallel electric field. As shown in FIG. 2B, under the action of pressure, the distance d between the first electrode array 2012 and the second electrode array 2022 decreases. In addition, because a volume of the cavity structure in the first spacer layer 204 decreases with the action of the pressure, the dielectric constant c increases accordingly. Therefore, the capacitor value of the electrostatic capacitor of the unit capacitor increases.

Compared with the electrostatic capacitor of the unit capacitor, the double electric layer capacitor of the unit capacitor is much larger. Therefore, when the sensor is under pressure, because the contact area of the electrode and the microstructure increases, the magnitude of the total $C_{EDL}$ changes drastically with the increase of $C_{1EDL}$, that is, increases drastically with the increase of the contact area of the electrode and the microstructure of the dielectric layer, thereby presenting high sensitivity.

Therefore, the embodiments of this disclosure implement flexibility, high sensing density, and high sensing sensitivity of a mechanical sensing system by directly fabricating the flexible electrode array is directly fabricated on the substrate of the flexible thin film material and using the flexible ionic sensing active material as the dielectric layer. In addition, the embodiments of this disclosure further greatly reduce the signal drift of the sensor and increases the stability of the sensor through the design of the spacer layer. The flexible capacitor array in the embodiments of this disclosure as a whole presents flexibility and greatly improves sensitivity, stability and a capability to withstand high pressure of a pressure sensing system.

In some embodiments, a second spacer layer (not shown) may also be included between the dielectric layer 203 and the second electrode array 2022. In this case, the second double electric layer capacitor $C_{2EDL}$ includes the second electrode, the second spacer layer, and the dielectric layer 203. Similarly, in a pressed state, the dielectric layer 203 in the unit capacitor passes through the second spacer layer to come into contact with the second electrode to form at least one second contact surface, a second micro double electric layer capacitor is formed at each of the at least one contact surface, and at least one second micro double electric layer capacitor at the at least one contact surface is connected in parallel to form the second double electric layer capacitor. In this case, the second double electric layer capacitor $C_{2EDL}$ is the variable double electric layer capacitor. In this case, in a pressed state, because the contact area of the electrode and the microstructure increases, the magnitude of the total $C_{EDL}$ changes drastically with the increase of $C_{1EDL}$ and $C_{2EDL}$, that is, increases drastically with the increase of the contact area of the first electrode, the second electrode, and the microstructure of the dielectric layer, thereby presenting the high sensitivity.

Figure 3A:
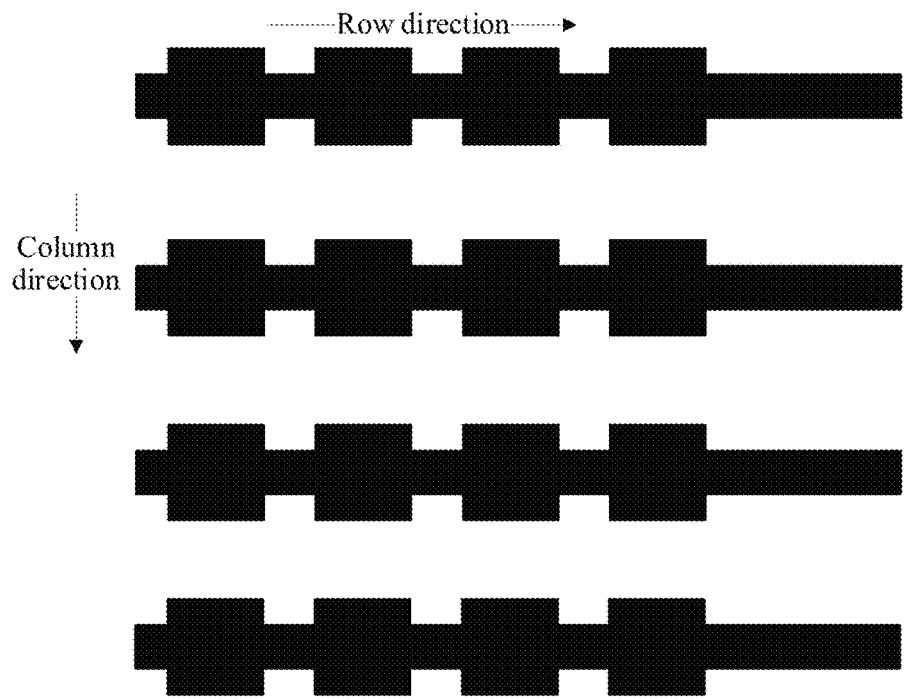
FIG. 3A is a schematic diagram of a portion of a first electrode array in a flexible capacitor array according to an embodiment of this disclosure.
Figure 3B:
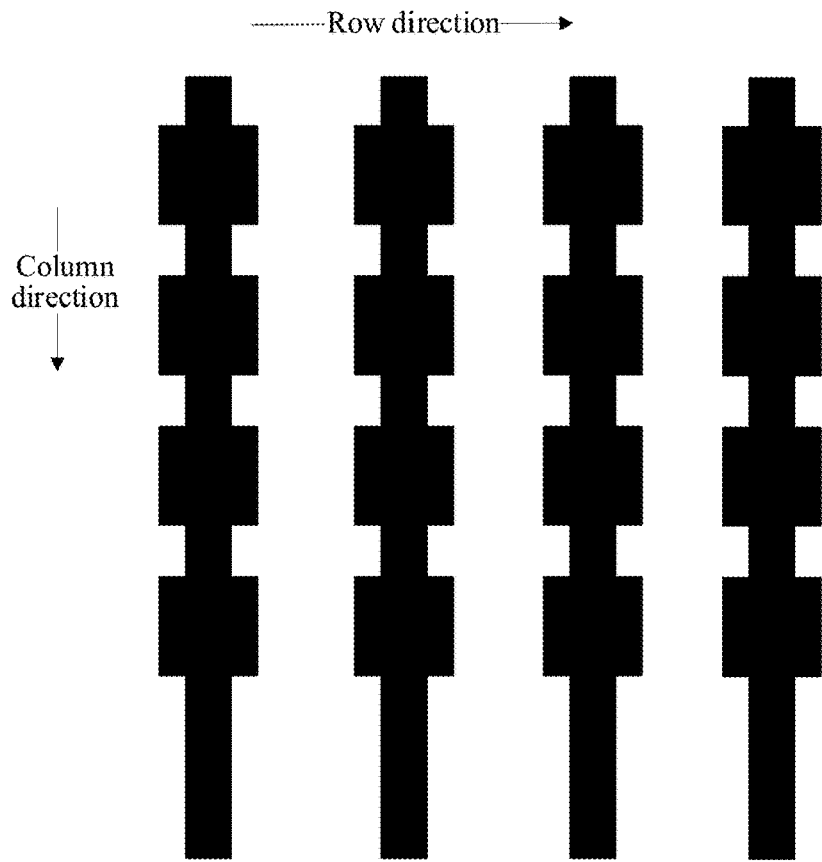
FIG. 3B is a schematic diagram of a portion of a second electrode array in a flexible capacitor array according to an embodiment of this disclosure.
Figure 3C:
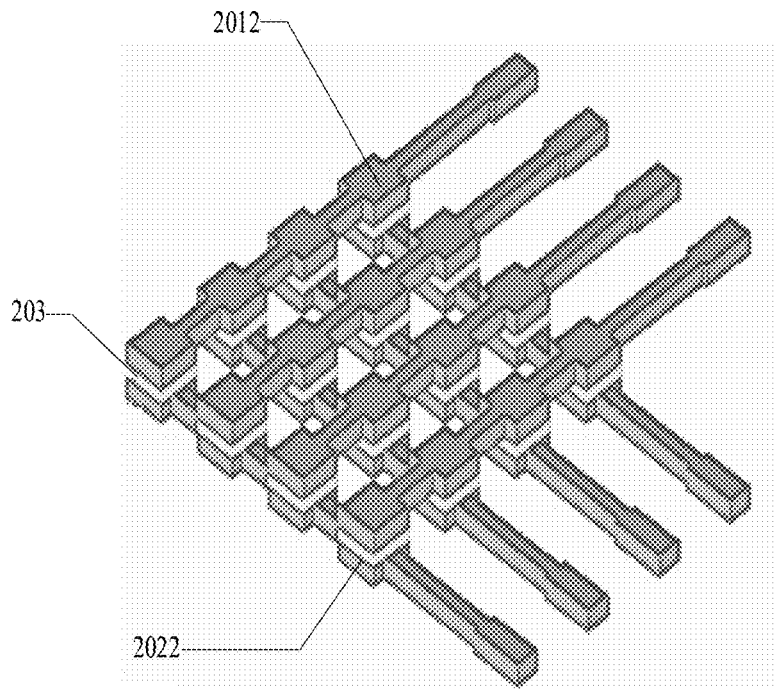
FIG. 3C is a schematic structural diagram of a flexible capacitor array according to an embodiment of this disclosure.

FIG. 3A is a schematic diagram of a portion of a first electrode array 2012 in a flexible capacitor array 20 according to an embodiment of this disclosure. FIG. 3B is a schematic diagram of a portion of a second electrode array 2022 in a flexible capacitor array 20 according to an embodiment of this disclosure. FIG. 3C is a schematic structural diagram of a flexible capacitor array 20 according to an embodiment of this disclosure.

In the embodiments shown in FIG. 3A and FIG. 3B, a plurality of first electrodes in the same row in the first electrode array 2012 are electrically connected in a row direction to form M electrode strings parallel in the row direction, and a plurality of second electrodes in the same column in the second electrode array 2022 are electrically connected in a column direction to form N electrode strings parallel in the column direction.

The first electrode array 2012 and the second electrode array 2022 are arranged opposite to each other, and the row direction and the column direction are different. In some embodiments, the row direction and the column direction are almost perpendicular.

An electrode pattern of at least one of the first electrode or the second electrode is circular, rectangular, or square. For example, the electrode pattern may be squares shown in FIG. 2A and FIG. 2B. Certainly, a size of the electrode pattern may be determined according to an actual application scenario. This is not limited in this application.

FIG. 3C is a schematic structural diagram of the flexible capacitor array 20, which may be used in the intelligent quadruped robot. In some embodiments, for the intelligent quadruped robot, a size of the flexible capacitor array 20 may be designed to be 5 mm*5 mm. The array for a single-foot plantar pressure distribution test of the intelligent quadruped robot may include one or more flexible capacitor arrays 20 of 5 mm*5 mm. In some embodiments, at least 4 flexible capacitor arrays 20 may be provided for each leg of the intelligent quadruped robot 10 in FIG. 1, and 16 flexible capacitor arrays 20 may be needed for four legs. Because four legs of the quadruped robot 10 all can obtain pressure feedback information, the pressure feedback of the four legs can be comprehensively analyzed, to rapidly respond to a tendency of a center of gravity of the intelligent quadruped robot to provide a movement stability basis. Therefore, the embodiments of this disclosure can provide a rapid and accurate feedback on the distribution and magnitude of quantitative plantar pressure for the movement of the quadruped robot (for example, a robot dog), thereby simplifying a complex process of calculating a torque by using a rigid force sensor (for example, a multi-axis force sensor).

In some embodiments, each flexible capacitor array 20 may include 4*4 unit capacitors, 16 unit capacitors in total. The first electrode array 2012 uses 4 sensing units as a series-connected electrode, 4 columns in total. The second electrode array 2022 also includes 4 columns of electrode strings in which 4 electrodes are connected in series. Therefore, the flexible capacitor array 20 has 8 electrode lead wires in total. Finally, by overlapping the dielectric layer 203 and the first spacer layer 204, the flexible capacitor array 20 including a 4*4 standard array can be fabricated.

Therefore, when the flexible capacitor array 20 receives pressure, the flexible capacitor array 20 may locate changes of one or more capacitors in the 4*4 electrode array, thereby determining the magnitude and the position of the pressure. The embodiments of this disclosure implement flexibility, high sensing density, high sensing sensitivity, high stability, and a capability to measure high pressure of the flexible capacitor array 20 by directly fabricating the flexible electrode array on the substrate of the flexible thin film material and using the flexible ionic sensing active material as the dielectric layer, and providing the spacer layer between the electrode and the dielectric layer. Compared with the multi-axis force sensor in the related art, because materials of the flexible capacitor array 20 are all formed by flexible materials, the flexible capacitor array 20 can be better attached to a curved or uneven outer surface of the robot and is not prone to fall off. Therefore, better adhesion is implemented. Line arrangements in the electrode arrangements shown in FIG. 3A to FIG. 3C are clear, which can simplify a test workload (a whole series of electrodes may be tested at one time), reduce a wiring space of the lead wire, and reduce the crosstalk between the electrodes, thereby implementing the high-density electrode arrangement.

FIG. 3A to FIG. 3C schematically show examples of some electrode distributions in the first electrode array 2012 and the second electrode array 2022. However, the embodiments of this disclosure do not limit a quantity, arrangements, and specific positions of the electrodes included in the first electrode array 2012 and the second electrode array 2022, provided that the flexible capacitor array 20 can detect the touch position and the touch pressure.

Figure 4A:
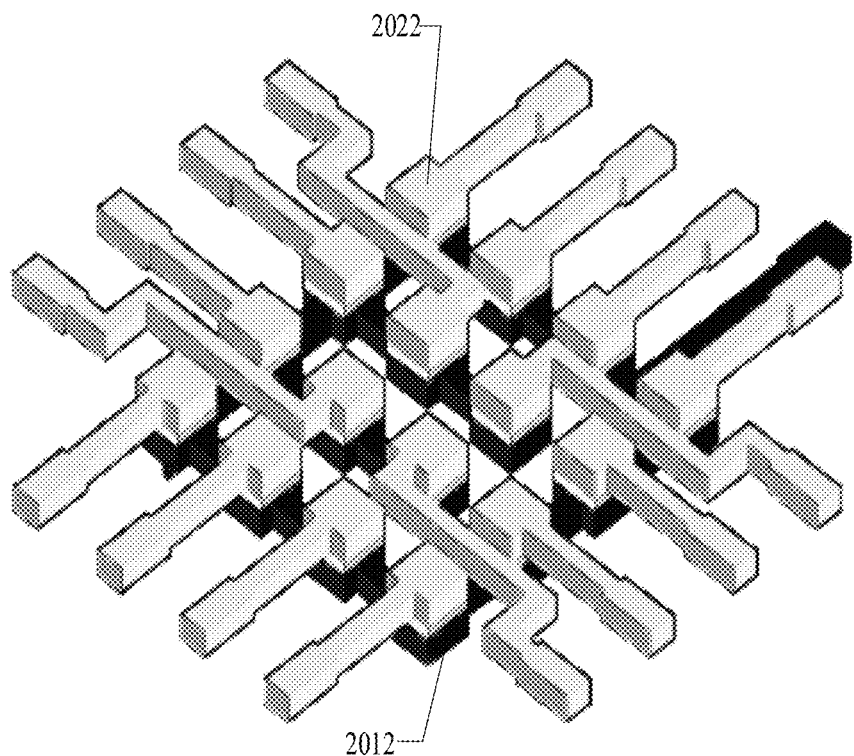
FIG. 4A is another schematic structural diagram of a flexible capacitor array according to an embodiment of this disclosure.
Figure 4B:
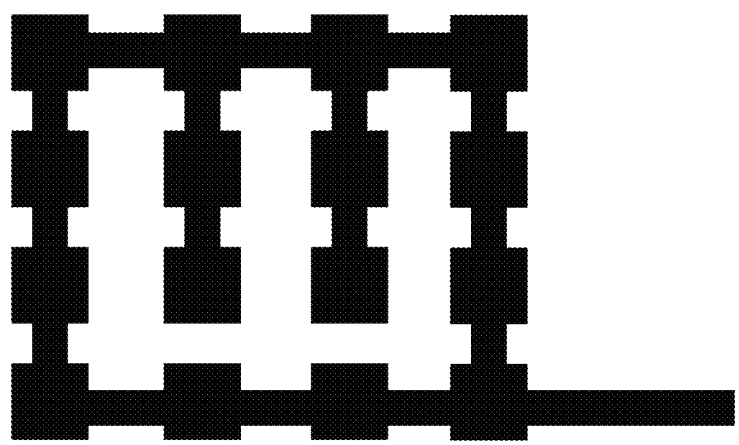
FIG. 4B is a top view of a first electrode array of a flexible capacitor array according to an embodiment of this disclosure.
Figure 4C:
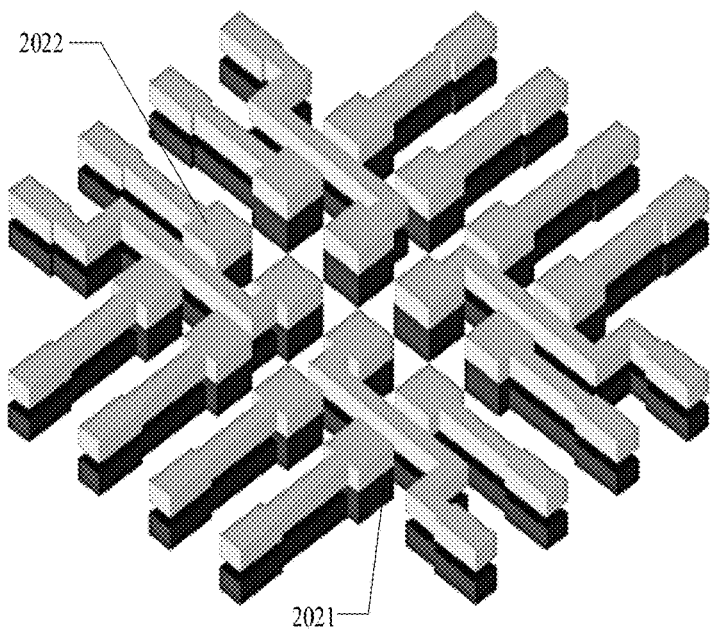
FIG. 4C is another schematic structural diagram of a flexible capacitor array according to an embodiment of this disclosure.

FIG. 4A is another schematic structural diagram of a flexible capacitor array 20 according to an embodiment of this disclosure. FIG. 4B is a top view of a portion of a first electrode array 2012 of a flexible capacitor array 20 according to an embodiment of this disclosure. FIG. 4C is another schematic structural diagram of a flexible capacitor array 20 according to an embodiment of this disclosure.

Referring to FIG. 4A and FIG. 4C, similar to the foregoing embodiments, the electrode pattern of at least one of the plurality of electrodes in the first electrode array 2012 or the second electrode array 2022 is circular, rectangular, or square.

The plurality of the first electrodes in the first electrode array are electrically connected to each other, and are jointly electrically connected to a common lead wire. For example, each electrode in the first electrode array 2012 is at least connected to another electrode in the first electrode array 2012 (forming a Chinese character "J") in FIG. 4A, while each second electrode in the second electrode array 2022 has a separate lead wire. For a 4*4 array, 16 electrodes in the first electrode array 2012 are respectively connected to other electrodes in the first electrode array 2012. The 16 electrodes in the first electrode array 2012 have one electrode lead-out wire in total. Each electrode in the second electrode array 2022 uses one electrode lead-out wire, that is, the flexible capacitor array 20 has 17 electrode lead-out wires in total (the first electrode array 2012 has one electrode lead-out wire, and the second electrode array 2022 has 16 electrode lead-out wires).

In FIG. 4C, each first electrode in the first electrode array 2012 has a separate lead wire. Each second electrode in the second electrode array 2022 has a separate lead wire. Because each electrode has a separate lead wire, it can reduce crosstalk between electrodes. An electrical property of each unit capacitor in FIG. 4C is separate. The unit capacitor is arranged and fixed according to an array scheme. Therefore, an electrical signal interference in the flexible capacitor array 20 is largely eliminated. Because each unit capacitor needs at least two upper and lower electrodes, the arrangement in FIG. 4C has 32 electrode lead-out lines in total.

In the electrode arrangements shown in FIG. 4A to FIG. 4C, the two electrodes arranged opposite to each other in the first electrode array 2012 and the second electrode array 2022, and the dielectric layer and the spacer layer therebetween form the unit capacitor. Each unit capacitor may work separately as a separate sensor, which is beneficial to mechanical detection of a complex space.

FIG. 4A to FIG. 4C schematically show examples of some electrodes and lead wire distributions in the first electrode array 2012 and the second electrode array 2022. However, the embodiments of this disclosure do not limit the quantity, the arrangements, lead wire arrangements, and the specific positions of the electrodes included in the first electrode array 2012 and the second electrode array 2022, provided that the flexible capacitor array 20 can detect the position and magnitude of the pressure.

Figure 5:
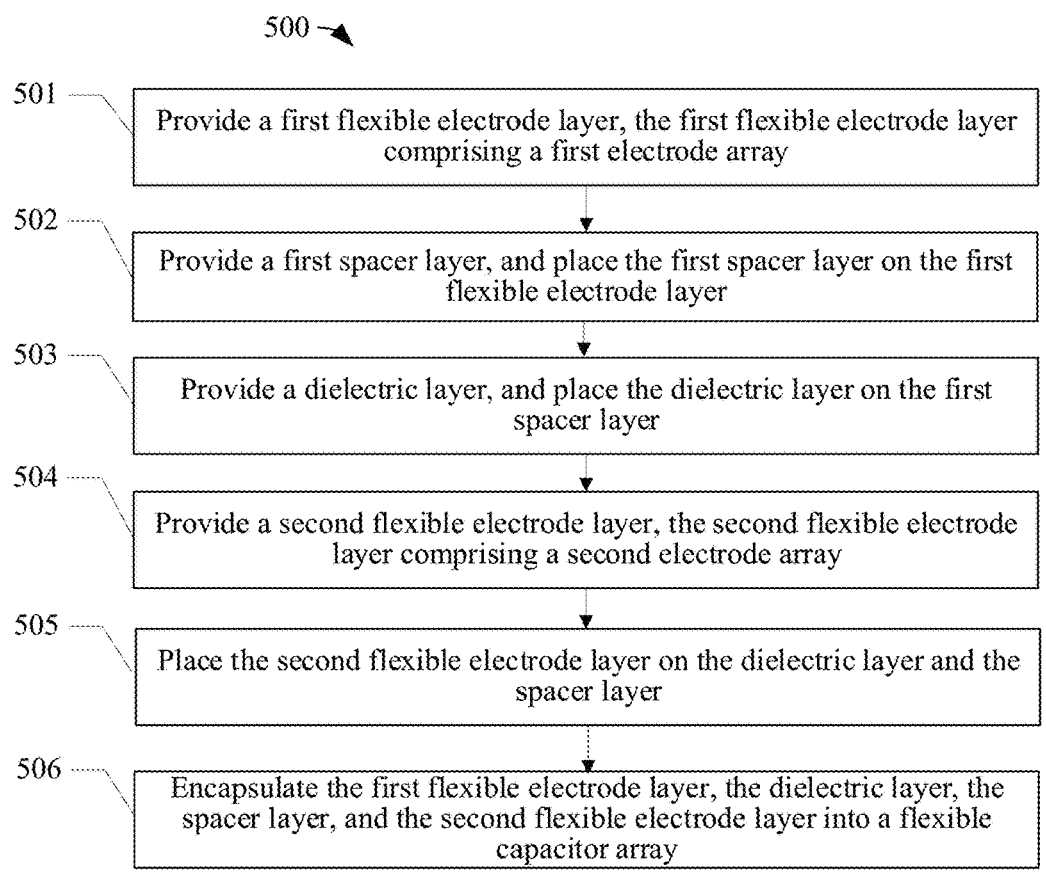
FIG. 5 is a flowchart of a preparation method for a flexible capacitor array according to an embodiment of this disclosure.

FIG. 5 is a flowchart of a preparation method 500 for a flexible capacitor array 20 according to an embodiment of this disclosure. The preparation method 500 in the embodiments of this disclosure includes the following steps. Although step 501 to step 506 in the preparation method 500 are shown in sequence, a person skilled in the art is to understand that steps may be performed in a different order from that shown in FIG. 5, or steps may be performed simultaneously. Embodiments of such alternate sequence may include overlapping, interleaved, interrupted, reordered, incremental, preparatory, supplemental, simultaneous, reversed, or another variant sequence.

In step 501, the first flexible electrode layer 201 may be provided. The first flexible electrode layer 201 includes a first electrode array 2012. A plurality of first electrodes in the first electrode array 2012 are arranged into a matrix including M rows and N columns, M and N being positive integers. For example, the patterned first electrode array 2012 may be sprayed on the first flexible thin film layer 2011 of the first flexible electrode layer 201 by using silver nanowire spraying. Alternatively, the patterned first electrode array 2012 may be evaporated on the first flexible thin film layer 2011 of the first flexible electrode layer 201 by using electron beam evaporation. As described above, the first flexible thin film layer 2011 may be made of at least one of the following materials: TPU elastomer rubber, PET, PVDF, PVA, PA6, PLA, PAN, and PES.

For example, a fabricated mask may be used for assisting the foregoing silver nanowire spraying and electron beam evaporation processes. For example, each electrode in the electrode pattern in the mask may be circular, rectangular, or square.

In step 502, the first spacer layer 204 may be provided and placed on the first flexible electrode layer 201. Preparing the first spacer layer 204 may include at least one of the following: preparing a PDMS thin film of a micro-pillar structure to form a cavity formed by a PDMS support column; preparing a polymer thin film, and cutting the polymer thin film into a polymer thin film with a frame-shaped bracket to form a cavity formed by a frame-shaped bracket of the polymer thin film; and placing a polymer solution on a template of a mesh-shaped structure, and solidifying the mixed solution to obtain the first spacer layer 204, to form the cavity formed by the mesh-shaped polymer thin film.

In step 503, the dielectric layer 203 may be provided and placed on the first spacer layer 204. The dielectric layer 203 is an ion gel thin film formed by $PVA-H_3PO_4$. A preparation method for the dielectric layer 203 is as follows: First, a PVA simple substance is dissolved in water. For example, PVA is added to a container filled with water, then the container is heated through a water bath, and stirred at about 90° C., and after about 1-2 hours, PVA is completely dissolved in the water to form a colorless and transparent gel-like solution. Then, phosphoric acid is added to the gel-like solution to form a mixed solution. For example, the phosphoric acid ($H_3PO_4$) may be added to the PVA water solution, and stirred at room temperature for about 1 hour through a magneton. Then the whole solution is transparent, mixed with a few flocculent substances. In this case, the mixed solution (PVA-$H_3PO_4$ water solution) is prepared. Then, the mixed solution may be poured on the microstructure template. For example, the $PVA-H_3PO_4$ water solution is poured onto a surface of a prepared structure template, and the thin film may be peeled off after solidifying, to obtain an ion gel thin film of $PVA-H_3PO_4$. Finally, the ion gel thin film is cut into a required size, and sealed and stored for use.

The embodiments of this disclosure do not limit the order of preparing the dielectric layer 203 and the first spacer layer 204. For example, in the embodiments of this disclosure, the dielectric layer 203 may be prepared first, and then the first spacer layer 204 may be prepared.

In step 504, the second flexible electrode layer 202 is prepared and provided with a second electrode array 2022. A plurality of second electrodes in the second electrode array 2022 are arranged into a matrix including M rows and N columns. Similarly, the patterned second electrode array 2022 may be sprayed on the second flexible thin film layer 2021 of the second flexible electrode layer 202 by using silver nanowire spraying. Alternatively, the patterned second electrode array 2022 may be evaporated on the second flexible thin film layer 2021 of the second flexible electrode layer 202 by using electron beam evaporation. As described above, the second flexible thin film layer 2021 may be made of at least one of the following materials: TPU elastomer rubber, PET, PVDF, PVA, PA6, PLA, PAN, and PES. The electrode pattern of the second electrode array 2022 may be similar to that of the first electrode array 2012.

In step 505, the second flexible electrode layer 202 is placed on the dielectric layer 203, so that the second electrode in the $i^{th}$ row and the $j^{th}$ column in the second electrode array 2022 and the first electrode in the $i^{th}$ row and the $j^{th}$ column in the first electrode array 2012 are arranged opposite, to form the electrode pair, i being greater than or equal to 0 and being less than M, and j being greater than or equal to 0 and being less than N.

In step 506, the first flexible electrode layer 201, the dielectric layer 203, the first spacer layer 204, and the second flexible electrode layer 202 are encapsulated into the flexible capacitor array 20.

For example, a vacant position in the first flexible electrode layer 201 that is not in contact with the dielectric layer (for example, spaces between a plurality of series-connected electrodes) may be filled with various fillers, such as a double-sided tape. Then, the second flexible electrode layer 202 is placed on the dielectric layer 203. In an embodiment, the first flexible electrode layer 201 and the second flexible electrode layer 202 are bonded together by the fillers in the vacant position, thereby completing the encapsulation of the flexible capacitor array 20.

Each electrode pair arranged opposite in the first electrode array and the second electrode array, and portions of the first spacer layer and the dielectric layer between the electrode pair form the unit capacitor of the flexible capacitor array. Each unit capacitor includes the first double electric layer capacitor and the second double electric layer capacitor connected in series. The first double electric layer capacitor includes the first electrode, the first spacer layer, and the dielectric layer. In a pressed state, the dielectric layer in the unit capacitor passes through the first spacer layer to come into contact with the first electrode to form at least one first contact surface, a first micro double electric layer capacitor is formed at each of the at least one contact surface, and at least one first micro double electric layer capacitor at the at least one contact surface is connected in parallel to form the first double electric layer capacitor.

Figure 6A:
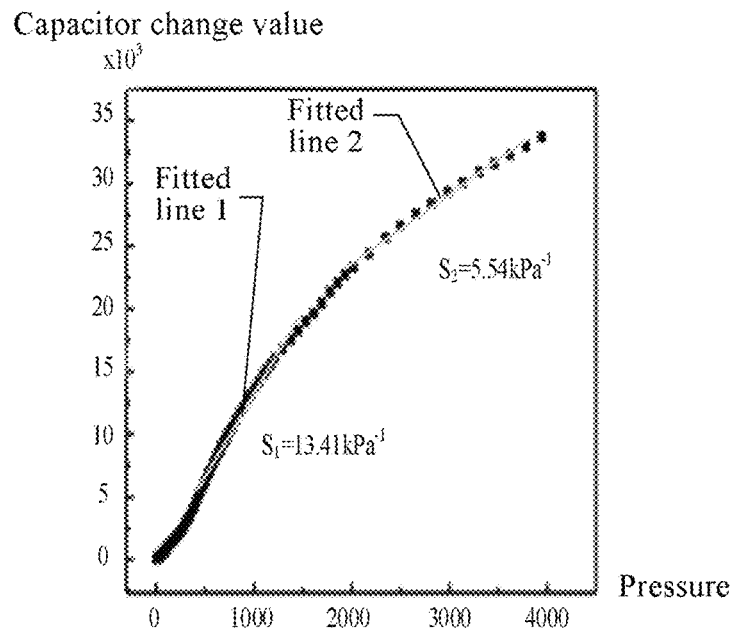
FIG. 6A is a schematic sensitivity diagram of a flexible capacitor array according to an embodiment of this disclosure.
Figure 6B:
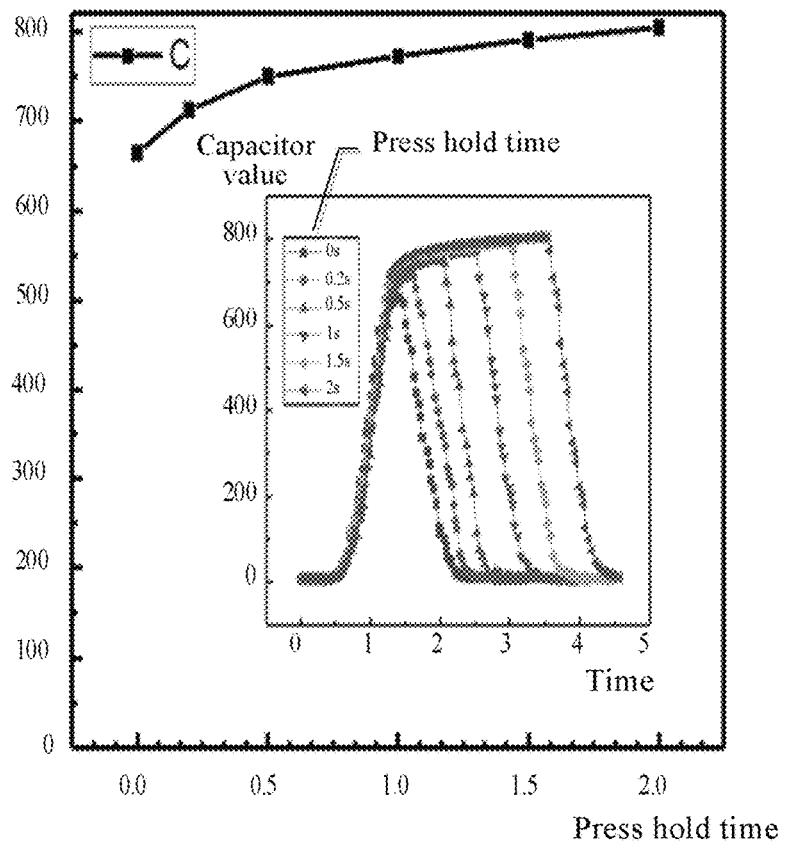
FIG. 6B is a capacitance drift curve over time of a flexible capacitor array according to an embodiment of this disclosure.
Figure 6C:
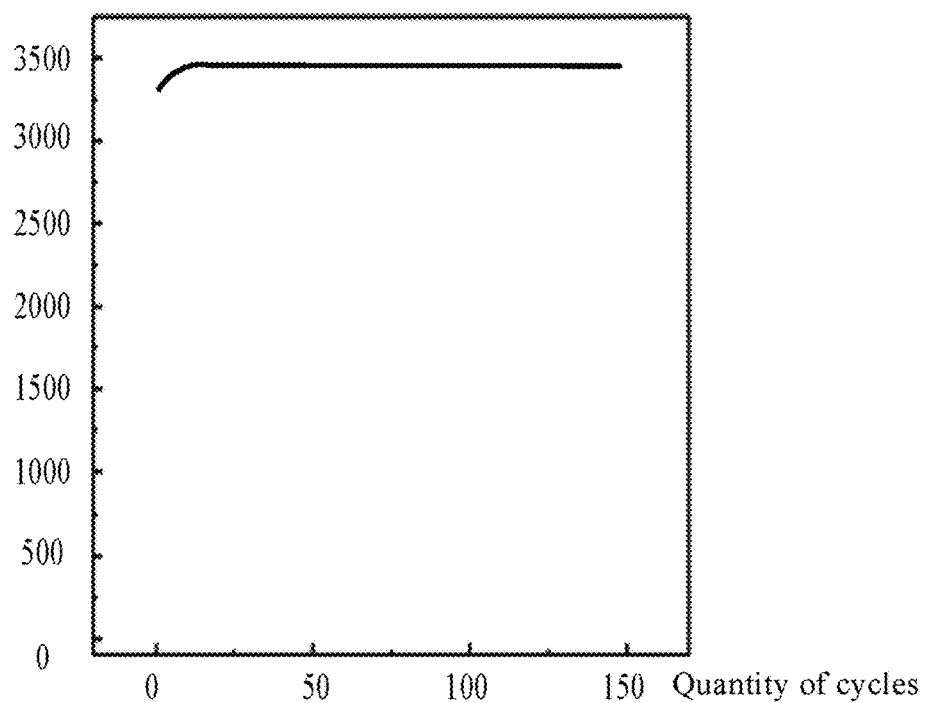
FIG. 6C is a cyclic test curve of a flexible capacitor array according to an embodiment of this disclosure.
Figure 6D:
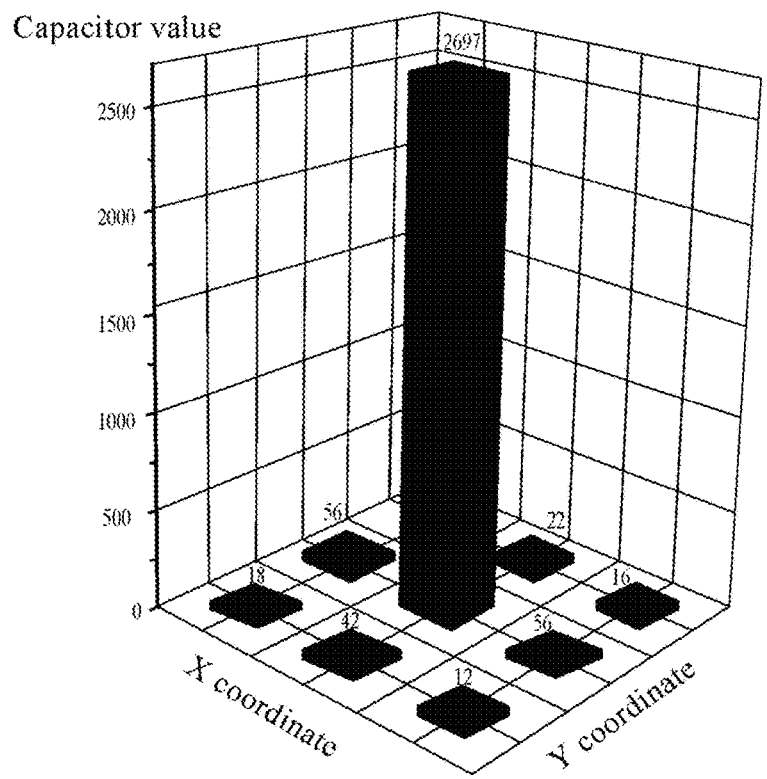
FIG. 6D is an array diagram of a flexible capacitor array according to an embodiment of this disclosure.

FIG. 6A is a schematic sensitivity diagram of a flexible capacitor array 20 according to an embodiment of this disclosure. FIG. 6B is a capacitance drift curve over time of a flexible capacitor array 20 according to an embodiment of this disclosure. FIG. 6C is a cyclic test curve of a flexible capacitor array 20 according to an embodiment of this disclosure. FIG. 6D is an array diagram of a flexible capacitor array 20 according to an embodiment of this disclosure.

A horizontal coordinate of FIG. 6A is the pressure applied to the flexible capacitor array 20 (unit is kPa), and a vertical coordinate is a capacitor change value. Black points in FIG. 6A are measured values, and gray lines are fitted lines. The fitted line 1 may be used for presenting a relationship between the capacitor change value and pressure in a case in which the applied pressure is in a range of 500 kPa-1500 kPa. The fitted line 2 may be used for presenting a relationship between the capacitor change value and pressure in a case in which the applied pressure is in a range of 2000 kPa-4000 kPa. As shown in FIG. 6A, when a pressure of 1000 kPa is applied to the flexible capacitor array 20, the capacitor change value is about 1000 kPa*13.41 kPa$^{-1}$=13.41*10$^3$. In a case of applying a pressure of 3000 kPa, the capacitor change value is about 3000 kPa*5.54 kPa$^{-1}$=16.62*10$^3$. It can be seen that the sensitivity of the flexible capacitor array 20 is significantly higher than that of a conventional capacitor array.

A horizontal coordinate of a large picture of FIG. 6B is a press hold time of pressing a unit capacitor in the flexible capacitor array 20 (a start point of the press hold time is 0.0 seconds on the horizontal coordinate), and a vertical coordinate is the capacitor value of the unit capacitor (a start point is 0 on the vertical coordinate). A small picture in FIG. 6B shows a manner in which the unit capacitor is measured. For example, each curve of the small picture in FIG. 6B respectively shows, in a case of releasing the pressing force after pressing one unit capacitor in the flexible capacitor array 20 for 0 seconds, 0.2 seconds, 0.5 seconds, 1 second, 1.5 seconds and 2 seconds, the curve that the capacitor value of the unit capacitor changes with time. A maximum capacitor value of each curve in the small picture is a vertical coordinate value corresponding to each point in the large picture. As shown in FIG. 6B, when the time for pressing the flexible capacitor array 20 is 0.5 seconds, the capacitor change value of the flexible capacitor array 20 is about 750 pF. When the time for pressing the flexible capacitor array 20 is 1.5 seconds, the capacitor change value of the flexible capacitor array 20 is also about 750 pF. It can be seen that even if the flexible capacitor array 20 is continuously pressed, the capacitor value of the flexible capacitor array 20 does not change much. Compared with the flexible capacitor sensor in the related art, the stability of the flexible capacitor array 20 is significantly improved.

A horizontal coordinate of FIG. 6C is a quantity of cycles of pressing the flexible capacitor array, and a vertical coordinate is a maximum capacitor value in each cycle. FIG. 6C shows a case in which the flexible capacitor array 20 is pressed 1 to 150 times. As shown in FIG. 6C, when the flexible capacitor array 20 is repeatedly pressed, the capacitor value of the flexible capacitor array 20 is always stable without a sudden change.

FIG. 6D shows a case in which a certain unit capacitor in the flexible capacitor array 20 is pressed. The coordinates X and Y correspond to the position of the unit capacitor, and the vertical coordinate is a change of the unit capacitor. The capacitor value of the unit capacitor at a pressed position is significantly higher than the capacitor value of the unit capacitor at a non-pressed position. It can be seen that using the flexible capacitor array 20 as a mechanical sensor can accurately detect the position of the force.

Figure 7A:
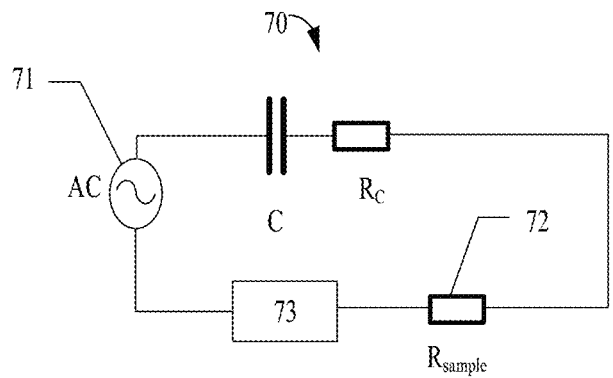
FIG. 7A is an equivalent circuit diagram of a capacitor array detection system according to an embodiment of this disclosure.
Figure 7B:
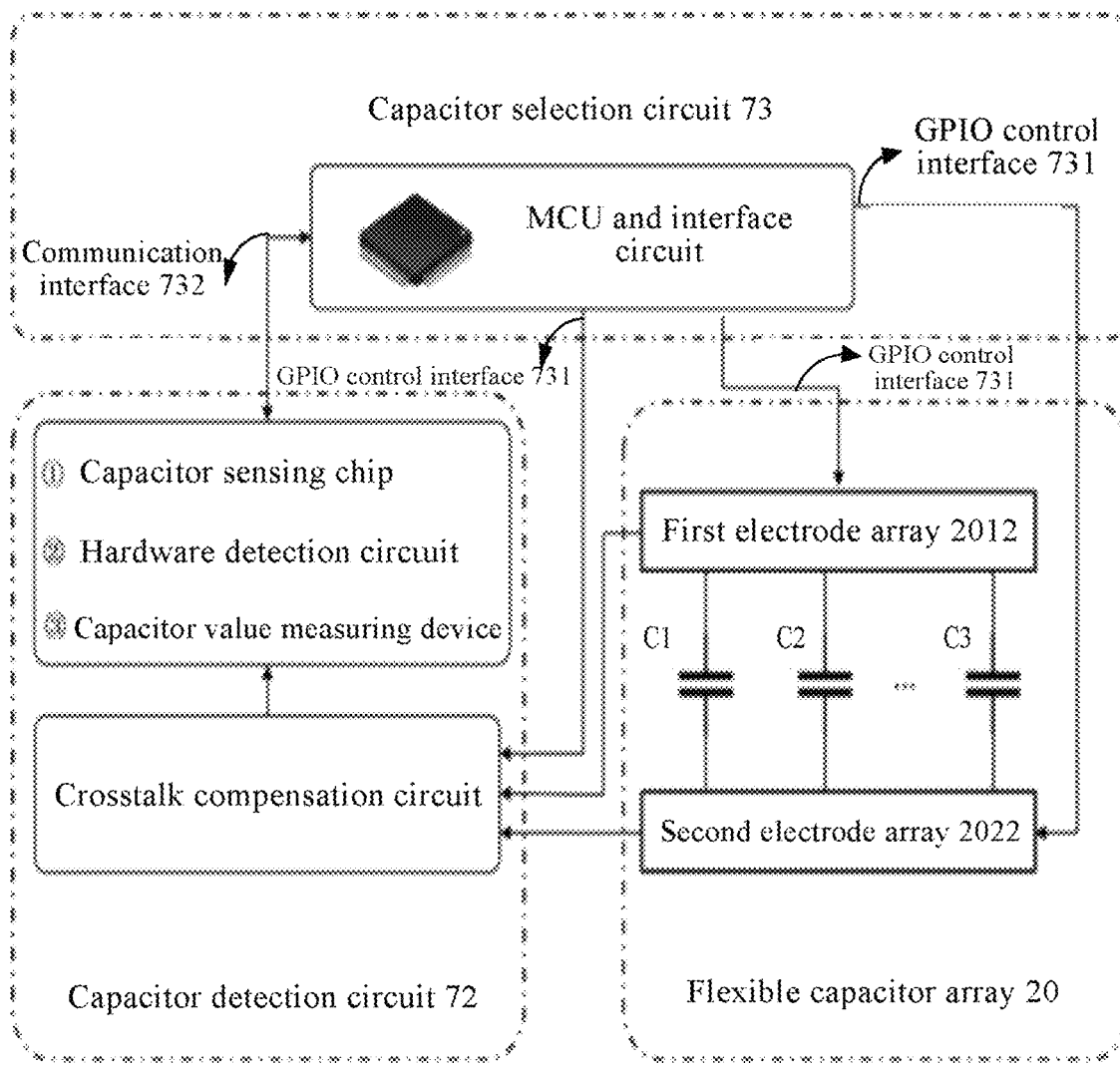
FIG. 7B is an architectural diagram of a capacitor array detection system according to an embodiment of this disclosure.
Figure 7C:
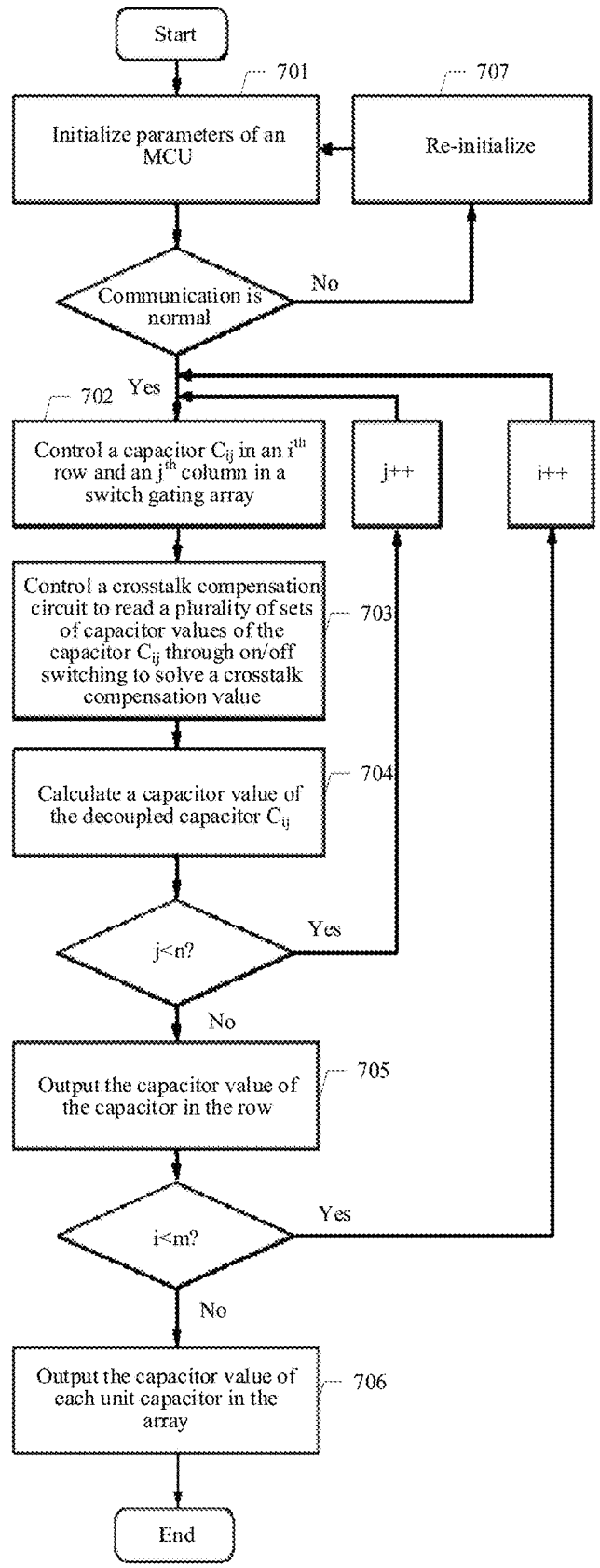
FIG. 7C is a flowchart of detecting pressure sensing information by a capacitor array detection system according to an embodiment of this disclosure.
Figure 7D:
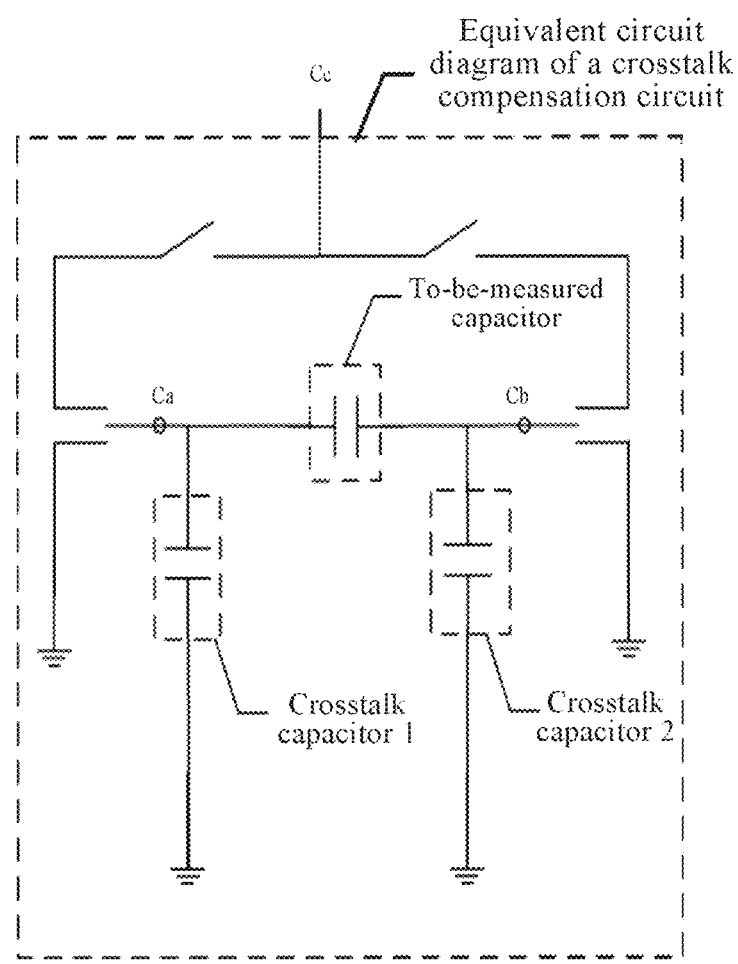
FIG. 7D is an equivalent circuit diagram of a crosstalk compensation circuit of a capacitor array detection system according to an embodiment of this disclosure.

FIG. 7A is an equivalent circuit diagram of a capacitor array detection system 70 according to an embodiment of this disclosure. FIG. 7B is an architectural diagram of a capacitor array detection system 70 according to an embodiment of this disclosure. FIG. 7C is a flowchart of detecting pressure sensing information by a capacitor array detection system 70 according to an embodiment of this disclosure. FIG. 7D is an equivalent circuit diagram of a crosstalk compensation circuit of a capacitor array detection system 70 according to an embodiment of this disclosure.

The capacitor array detection system 70 includes an excitation circuit 71, a flexible capacitor array 20, a capacitor detection circuit 72, and a capacitor selection circuit 73.

The capacitor selection circuit 73 is configured to gate at least one unit capacitor in the flexible capacitor array 20. In some embodiments, the capacitor selection circuit 73 is a switch circuit. For example, the capacitor selection circuit in FIG. 7A may be equivalent to a switch.

The excitation circuit 71 is configured to output an excitation signal to at least one electrode lead wire of the flexible capacitor array in the first electrode array and at least one electrode lead wire in the second electrode array under control of the capacitor selection circuit. In FIG. 7A, the excitation circuit 71 may be an alternating current power supply or a pulse signal source. Due to movements of anions and cations between electrodes during a process of detecting the capacitor, there is a correlation between a capacitor value and an excitation frequency. When the excitation frequency is higher, the capacitor value of the capacitor is smaller and more stable, but an ionic property is worse. Therefore, a response property of the unit capacitor may be quite different under different excitation frequencies. In some embodiments, the frequency of the excitation circuit 71 is $10^4$ Hz.

For example, for embodiments of a separate lead wire of each electrode shown in FIG. 4C, the electrode A in the first flexible electrode layer 1012 may be connected to one end of the excitation circuit 71, and the electrode B facing the electrode A in the second flexible electrode layer 1022 may be connected to the other end of the excitation circuit 71. An overlapping region of the electrode A and the electrode B in the flexible capacitor array 20 may be equivalent to the capacitor C in FIG. 7A. The remaining wires may be equivalent to a resistor $R_c$.

The capacitor detection circuit 72 is configured to detect a capacitor value of the at least one unit capacitor. In some embodiments, the capacitor detection circuit 72 may be a sampling resistor $R_{sample}$ in FIG. 7. As shown in FIG. 7A, the excitation circuit 71, the flexible capacitor array 20, and the capacitor detection circuit 72 form a loop. When an external force is applied, the capacitor value of the capacitor C changes. Further, voltages at two ends of the sampling resistor $R_{sample}$ change. The voltages at the two ends of the sampling resistor $R_{sample}$ may correspond to a detected capacitor value of the unit capacitor, and through a correspondence between the two, the detected capacitor value of the unit capacitor may be obtained. Although the capacitor value of the unit capacitor is correspondingly measured by measuring the voltages at the two ends of the sampling resistor $R_{sample}$, a person skilled in the art is to understand that the capacitor value of the unit capacitor may further be measured in another manner. This is not limited in this disclosure.

Then, the capacitor detection circuit 72 may further output the capacitor value of the at least one unit capacitor to a signal processor (not shown). The signal processor is configured to convert the capacitor value of the at least one unit capacitor into a magnitude and a position of the pressure. The signal processor may be implemented as a simulation signal processor that can convert the capacitor value into a simulation signal. Alternatively, the capacitor detection circuit 72 may be implemented as a data signal processor (DSP) that can convert the capacitor value into a digital signal, a field programmable gate array (FPGA), or the like. The embodiments of this disclosure do not limit the implementation of the signal processor.

In addition, for the electrode array described in FIG. 3C, because the electrodes in the first electrode array are connected in series in the first direction and the electrodes in the second electrode array are connected in series in the second direction, the capacitor selection circuit 73 may include a multiplexer for performing row and column scanning on the electrode array. One end of the multiplexer is connected to one end of the excitation circuit 71. For example, one end of each series-connected electrode in the first electrode array 2012 may be connected to one end of the multiplexer, and the other end is suspended. One end of each series-connected electrode in the second electrode array 2022 may be connected to the other end of the excitation circuit 71, and the other end is suspended. In another example, both ends of each series-connected electrode in the first electrode array 2012 are connected to the multiplexer. Both ends of each series-connected electrode in the second electrode array 2022 are connected to the capacitor detection circuit 72. In another example, both ends of each series-connected electrode in the first electrode array 2012 are respectively connected to both ends of the excitation circuit 71, and both ends of each series-connected electrode in the second electrode array 2022 are connected to the capacitor detection circuit 72. This disclosure does not limit the manner of performing row and column scanning on the electrode array described in FIG. 3C.

In some embodiments, the capacitor selection circuit 73 periodically gates one of the series-connected electrodes in the first electrode array 2012. It is assumed that the series-connected electrodes formed by the electrodes $A_1'$, $A_2'$ . . . and $A_k'$ connected in series in the first electrode array 2012 are gated at a certain moment. At this moment, the capacitor formed by the electrodes $B_1'$, $B_2'$ . . . and Bk where the second electrode array 2022 and the series-connected electrodes have an overlapping region and the electrodes $A_1'$, $A_2'$ . . . and $A_k'$ is turned on. An overlapping region of the electrode $A_1'$ and the electrode $B_1'$ may be equivalent to the capacitor C in FIG. 7A. The wires of the electrode $A_1'$ and the electrode $B_1'$ may be equivalent to a resistor $R_c$. In this case, k capacitors C in total are turned on. The excitation circuit 71, any one of the k capacitors C, and the capacitor detection circuit 72 all can form a loop, and in this case, there are k turned-on loops in total. If the overlapping region of the electrode $A_1'$ and the electrode $B_1'$ is touched in this case, the capacitor formed by the electrode $A_1'$ and the electrode $B_1'$ changes drastically. Further, the voltages at the two ends of the sampling resistor $R_{sample}$ change. The voltages at the two ends of the sampling resistor $R_{sample}$ may correspond to the capacitor value of the capacitor C, and the capacitor value of the capacitor C may be calculated based on the voltages.

Therefore, during the movement of the intelligent robot, an impact force is generated after the robot touches an object or a person, and the flexible capacitor array 20 can detect the impact force through the change of the capacitor of the robot. A position where the robot touches the object can be determined according to a position where the response is generated in the electrode array, and the magnitude of the impact force is roughly determined according to the change of the capacitor value. By analyzing the change of the capacitor value, the contact between the robot and an external object can be obtained, to provide information for a next action of the robot. The capacitor array detection system according to the embodiments of this disclosure has a great application value in robot safety, human-computer interaction, and the like.

FIG. 7A schematically shows a certain example of the capacitor array detection system 70, but a circuit connection manner of the capacitor array detection system 70 is not limited in the embodiments of this disclosure, provided that the flexible capacitor array 20 can detect the pressure.

Referring to FIG. 7B, the capacitor selection circuit 73 may further include an MCU and an interface circuit. For the capacitor arrays corresponding to FIG. 3C, FIG. 4A, and FIG. 4C, a switch circuit suitable for controlling the electrode in the first electrode array 2012 and a switch circuit for controlling the electrode in the second electrode array 2022 may be designed. That is, a controllable connection of upper and lower electrodes of each unit capacitor in the array, and the control lead wire of a controllable switch are all controlled by a GPIO of the MCU through the controllable switch. The purpose is to implement independent gating and turning off of each unit capacitor in the array, and at the same moment, a certain unit capacitor is gated to be connected to a subsequent stage capacitor detection circuit 72 through the controllable switch to measure the capacitor value. All unit capacitors in the flexible capacitor array 20 are controlled by the MCU to turn on and off. The MCU turns on the unit capacitors in sequence, and implements capacitor value detection of all the unit capacitors of the entire flexible capacitor array 20 in a scanning manner.

The capacitor detection circuit 72 provides, but not limited to, the following capacitor detection manners: ① detection by using an existing capacitor sensor chip, ② detection by building a hardware detection circuit (for example, the foregoing simple sampling resistance manner, or another hardware detection circuit including an operational amplifier and another component), and ③ use of a capacitor measuring device (such as LCR detection), or the like. The embodiments of this disclosure do not limit the manner in which the capacitor detection circuit 72 detects the capacitor value.

In some embodiments, to improve the stability of the flexible capacitor array 20 in the embodiments of this disclosure and enhance an anti-crosstalk capability of each unit capacitor of the array, the capacitor detection circuit 72 may further include a crosstalk compensation circuit. The circuit is formed by a controllable switch and a switching circuit, and the switch is also controlled by the MCU. When the capacitor array is scanned and detected, it is first sent to the crosstalk compensation circuit for processing, and then the capacitor value of each unit capacitor is measured by using the foregoing three detection methods. Then, a capacitor detection module connects the detected capacitor value of a corresponding unit capacitor to the signal processor, and performs subsequent signal processing, compensation, and analysis. The capacitor array detection system provided in the embodiments of this disclosure ensures that the capacitor array in the embodiments of this disclosure implements an ultra-wide measurement range, and enables each unit capacitor to have strong stability and consistency.

An equivalent circuit of the crosstalk compensation circuit may be as shown in FIG. 7D. In some embodiments, the crosstalk compensation circuit may be configured to control, under the control of the capacitor selection circuit, the capacitor detection circuit 72 to detect at least one crosstalk compensation value of the at least one unit capacitor. As shown in FIG. 7D, terminals Ca and Cb of the crosstalk compensation circuit are respectively connected to the lead wire of the first electrode array and the lead wire of the second electrode array of the flexible capacitor array 20. For example, a certain specific to-be-measured capacitor may be gated through the MCU by controlling the lead wire connected to the terminals Ca and Cb. In addition, a terminal Cc of the crosstalk compensation circuit is connected to the capacitor detection circuit 72 for detecting the capacitor value/crosstalk compensation value. When the MCU gates a certain to-be-measured capacitor, the to-be-measured capacitor and another capacitor in the flexible capacitor array 20 that affects the to-be-measured capacitor may be equivalent to an equivalent circuit formed by the to-be-measured capacitor, a crosstalk capacitor 1, and a crosstalk capacitor 2 in FIG. 7D. The MCU can control four switches of the crosstalk compensation circuit to measure a plurality of sets of values of the to-be-measured capacitor, the crosstalk capacitor 1, and the crosstalk capacitor 2 in various series and parallel connections in sequence. Then, through the capacitor calculation circuit, the accurate capacitor value of the to-be-measured capacitor can be calculated by calculating the capacitor values (that is, the crosstalk compensation values) of the crosstalk capacitor 1 and the crosstalk capacitor 2 in various series and parallel connections. For example, the capacitor calculation circuit may be configured to update the capacitor value of the at least one unit capacitor according to the at least one crosstalk compensation value.

Referring to FIG. 7C, a process of detecting the capacitor value by the capacitor array detection system 70 is as follows:

First, the flexible capacitor array 20 may be arranged on a pressure sensing detection surface, and each unit capacitor in the flexible capacitor array 20 corresponds to a pressure sensing detection position of the pressure sensing detection surface. For example, for the intelligent robot, the pressure sensing detection surface may be at least a portion of a robot arm. The flexible capacitor array 20 may be attached to the pressure sensing detection surface, and the flexible capacitor array 20 may be connected to another component in the capacitor array detection system 70, to detect a touch pressure generated after the robot touches the person or the object during the movement of the robot. For a wearable device, the pressure sensing detection surface may be an outer surface of the wearable device. After the device is worn, touch data can be acquired and analyzed by the flexible capacitor array 20.

Then, the capacitor selection circuit 73 is configured to gate each unit capacitor in the flexible capacitor array 20 in sequence. In some embodiments, the capacitor selection circuit 73 may initialize parameters of the MCU in step 701, so that the MCU may gate each unit capacitor in the flexible capacitor array 20 in sequence. Before gating the unit capacitor, the capacitor selection circuit 73 may also detect whether control interfaces (for example, a GPIO control interface 731) and a communication interface 732 of the capacitor selection circuit 73 are normal. In a case in which the interfaces are normal, the capacitor selection circuit 73 may start to gate the unit capacitor in the flexible capacitor array 20 in step 702. If an interface is abnormal, the parameters of the MCU may be re-initialized in step 707.

Herein, an example in which a unit capacitor $C_{ij}$ in the flexible capacitor array 20 is gated is taken for description. $C_{ij}$ represents the unit capacitor in the $i^{th}$ row and the $j^{th}$ column in the flexible capacitor array 20. After the program runs, the MCU controls the controllable switch of the upper and lower electrodes of the capacitor array to gate $C_{ij}$, and then controls the controllable switch of the crosstalk compensation circuit in the capacitor detection module to switch $C_{ij}$ under a plurality of sets of circuit connected states, thereby solving at least one crosstalk compensation value of the unit capacitor in step 703. The capacitor calculation circuit updates the capacitor value of the unit capacitor according to the at least one crosstalk compensation value, thereby calculating a real capacitor value (the capacitor value after the impact of the crosstalk is removed) of $C_{ij}$ after compensation and decoupling in step 704. Then, the MCU scans, first column and then row, and reads the capacitor values of all capacitors in the capacitor array in sequence for a subsequent operation. The capacitor detection circuit 70 is further configured to output the capacitor value of each unit capacitor as pressure sensing information of the pressure sensing detection position in sequence in step 705, for subsequent processing of the robot.

Figure 8:
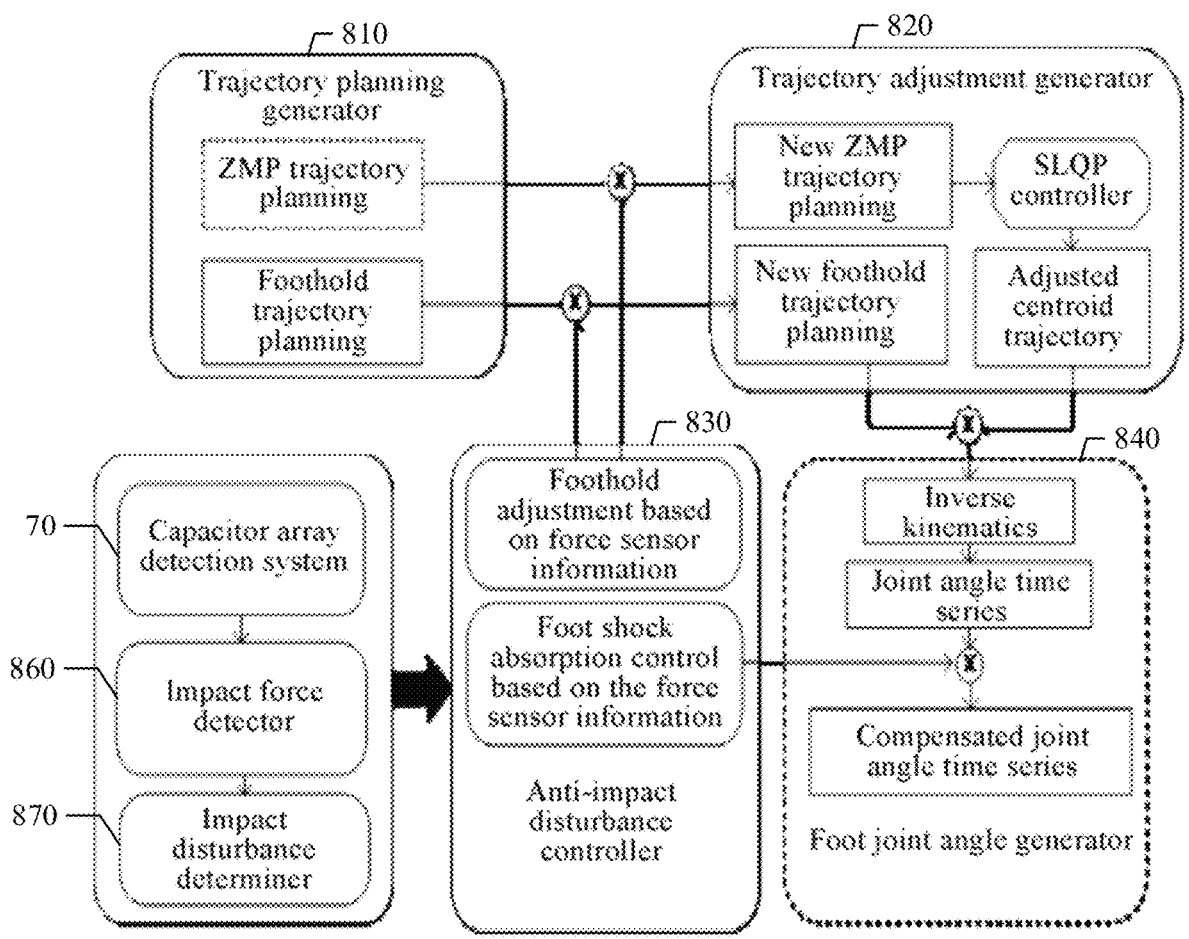
FIG. 8 is a schematic diagram of a robot according to an embodiment of this disclosure.

FIG. 8 is a schematic diagram of a robot 80 according to an embodiment of this application. The robot 80 includes the foregoing capacitor array detection system 70. A flexible capacitor array in the capacitor array detection system is arranged on at least one portion of a pressure sensing detection surface of the robot.

The robot 80 further includes an impact force detector 860, an impact disturbance determiner 870, and an anti-impact disturbance controller 830. In some embodiments, the impact force detector 860 is configured to calculate an impact force detection value and an impact force occurrence position according to the capacitor value of the at least one unit capacitor detected by the capacitor array detection system 70. In some embodiments, the capacitor array detection system 70 may periodically detect the capacitor value of each unit capacitor in the flexible capacitor array, and input the capacitor value to the impact force detector.

In some embodiments, the impact disturbance determiner 870 is configured to determine whether an impact disturbance occurs based on the impact force detection value and the impact force occurrence position calculated by the impact force detector. In some embodiments, the impact force detector 860 can calculate a ZMP stability margin of the robot at the moment through the impact force detection value and the impact force occurrence position, and uses the margin as a basis for determining whether the robot is disturbed by the outside, to implement quantitative and rapid detection of the magnitude, direction, and action time of the disturbance, and provides a trigger condition and a calculation basis for a subsequent control step.

In some embodiments, the anti-impact disturbance controller 830 is configured to, in response to the determined impact disturbance, adjust an operation parameter of the robot, and control the robot to resist the impact disturbance. The controlling an operation parameter of the robot includes controlling parameters of a step and a foothold of the robot. If the impact disturbance determiner 870 determines that the disturbance occurs, the anti-impact disturbance controller 830 adjusts the foothold of the robot based on the impact force detection value and the impact force occurrence position, and keeps the entire body of the robot stable by taking a step. At the same time, the anti-impact disturbance controller 830 further performs footing shock absorption control based on the impact force detection value and the impact force occurrence position, to implement smooth landing of a sole of a foot and reduce the footing impact.

In some embodiments, when the robot is a quadruped robot, the flexible capacitor array 20 may be laid on a pressure sensing detection surface of a sole of a foot of the quadruped robot. In some embodiments, at least 4 flexible capacitor arrays 20 may be provided for each leg of the quadruped robot 10 in FIG. 1, and 16 flexible capacitor arrays 20 may be needed for four legs. Because four legs of the quadruped robot 10 all can obtain pressure feedback information, the pressure feedback of the four legs can be comprehensively analyzed, to rapidly respond to a tendency of a center of gravity of the intelligent quadruped robot to provide a movement stability basis.

In some embodiments, the adjusting an operation parameter of the robot by the anti-impact disturbance controller 830 further includes: adjusting a foothold or a footing angle of the quadruped robot. The anti-impact disturbance controller 830 further includes: a trajectory planning generator 810, a trajectory adjustment generator 820, and a foot joint angle generator 840. The trajectory planning generator 810 is configured to plan a centroid trajectory and a foothold trajectory of the quadruped robot. The trajectory planning generator 810 may plan a walking trajectory of the quadruped robot through the ZMP stability margin, so that the robot always keeps balanced and stable. The trajectory planning generator 810 may further plan a movement trajectory of the foothold (or ankle joint) of the quadruped robot. When the impact disturbance determiner 870 determines that the impact disturbance occurs, the trajectory adjustment generator 810 may further adjust a walking state of the quadruped robot according to the impact disturbance. For example, the trajectory adjustment generator 820 may be configured to adjust the centroid trajectory of the quadruped robot based on the centroid trajectory and the impact detection value of the quadruped robot; and adjust the foothold trajectory of the quadruped robot based on the foothold trajectory of the quadruped robot. In some embodiments, after the trajectory adjustment generator 820 adjusts an original trajectory planning, a built-in linear quadratic regulator (SLQP) may be used for controlling the generated centroid trajectory. Finally, the robot 80 may use the foot joint angle generator 840 to control walking balance of the quadruped robot. In some embodiments, the foot joint angle generator 840 may be configured to adjust, based on the adjusted centroid trajectory and foothold trajectory, adjust the foothold or the footing angle of the quadruped robot by adjusting a foot joint angle of the quadruped robot. The foot joint angle generator 840 may solve a joint angle time series through inverse kinematics. At the same time, the foot shock absorption control performs online compensation for the calculated joint angle, so that the quadruped robot can still maintain stable walking even when subjected to an external disturbance.

The embodiments of this disclosure can provide a rapid and accurate feedback on the distribution and magnitude of plantar pressure for the movement of the quadruped robot (for example, a robot dog), thereby simplifying the conventional complex process of calculating a torque using a rigid force sensor (for example, a multi-axis force sensor).

The embodiments of this disclosure provide a flexible capacitor array and a preparation method therefor, a capacitor array detection system, and a robot, so that the flexible capacitor array as a whole presents flexibility and greatly improves sensitivity, stability and a capability to withstand high pressure of a pressure sensing system.

Next, the following several points need to be explained:

(1) The accompanying drawings of the embodiments of this disclosure involve only structures involved in the embodiments of this disclosure. For other structures, reference may be made to common designs.

(2) For clarity, in the accompanying drawings used for describing the embodiments of this disclosure, the thickness of layers or regions is enlarged or reduced, that is, these accompanying drawings are not drawn to actual scale. It is to be understood that, when an element such as a layer, thin film, region, or substrate is referred to as being "on" or "under" another element, the element can be "directly" "on" or "under" the another element, or an intermediate element may exist.

(3) The features in the embodiments in this disclosure may be mutually combined to obtain new embodiments without conflicts.

The foregoing descriptions are merely exemplary implementations of this disclosure, and are not intended to limit the protection scope of this disclosure. The protection scope of this disclosure is determined by the appended claims.

What is claimed is:

1. A flexible capacitor array, comprising:
    a first flexible electrode layer, the first flexible electrode layer comprising a first electrode array;
    a second flexible electrode layer, the second flexible electrode layer comprising a second electrode array;
    a dielectric layer, the dielectric layer being arranged between the first flexible electrode layer and the second flexible electrode layer;
    a first spacer layer, the first spacer layer being arranged between the first electrode array and the dielectric layer; and
    a second spacer layer, the second spacer layer being arranged between the second electrode layer and the dielectric layer, the dielectric layer arranged between the first spacer layer and the second spacer layer,
    each electrode pair arranged opposite in the first electrode array and the second electrode array, and portions of the first spacer layer and the dielectric layer between the electrode pair forming a unit capacitor of the flexible capacitor array, the unit capacitor comprising a first double electric layer capacitor, and the first double electric layer capacitor comprising the first electrode, the first spacer layer, and the dielectric layer; and
    in a pressed state, the dielectric layer in the unit capacitor passing through the first spacer layer to come into contact with the first electrode to form at least one first contact surface, a first micro double electric layer capacitor being formed at each of the at least one contact surface, and at least one first micro double electric layer capacitor at the at least one contact surface being connected in parallel to form the first double electric layer capacitor.

2. The flexible capacitor array according to claim 1, wherein a plurality of first electrodes in the first electrode array are arranged into a matrix comprising M rows and N columns, M and N being positive integers; and a plurality of second electrodes in the second electrode array are arranged into a matrix comprising M rows and N columns, and the second electrode in an $i^{th}$ row and an $j^{th}$ column in the second electrode array and the first electrode in an $i^{th}$ row and an $j^{th}$ column in the first electrode array are arranged opposite, to form the electrode pair, i being greater than or equal to 0 and being less than M, and j being greater than or equal to 0 and being less than N.

3. The flexible capacitor array according to claim 1, wherein the unit capacitor further comprises a second double electric layer capacitor connected in series to the first double electric layer capacitor, and the second double electric layer capacitor comprises the second electrode and the dielectric layer, the second electrode being in contact with the dielectric layer to form a second double electric layer capacitor, and the second double electric layer capacitor being connected in series to the first double electric layer capacitor.

4. The flexible capacitor array according to claim 1, wherein the unit capacitor further comprises a second double electric layer capacitor connected in series to the first double electric layer capacitor, and the second double electric layer capacitor comprises the second electrode, the second spacer layer, and the dielectric layer, in a pressed state, the dielectric layer in the unit capacitor passing through the second spacer layer to come into contact with the second electrode to form at least one second contact surface, a second micro double electric layer capacitor being formed at each of the at least one contact surface, and at least one second micro double electric layer capacitor at the at least one contact surface being connected in parallel to form the second double electric layer capacitor.

5. The flexible capacitor array according to claim 1, wherein the spacer layer comprises a cavity that separates the dielectric layer from at least one electrode in the electrode pair.

6. The flexible capacitor array according to claim 5, wherein the cavity comprises at least one of a cavity formed by a polydimethylsiloxane (PDMS) support column, a cavity formed by a frame-shaped bracket of a polymer thin film, or a cavity formed by a mesh-shaped polymer thin film.

7. The flexible capacitor array according to claim 2, wherein
    the plurality of first electrodes in the same row in the first electrode array are electrically connected in a row direction, to form M electrode strings parallel in the row direction; and
    the plurality of second electrodes in the same column in the second electrode array are electrically connected in a column direction, to form N electrode strings parallel in the column direction.

8. The flexible capacitor array according to claim 1, wherein
    a plurality of first electrodes in the first electrode array are electrically connected to each other, and
    are jointly electrically connected to a common lead wire, and each second electrode in the second electrode array has a separate lead wire.

9. The flexible capacitor array according to claim 1, wherein each first electrode in the first electrode array has a separate lead wire, and each second electrode in the second electrode array has a separate lead wire.

10. A preparation method for a flexible capacitor array, comprising:
    providing a first flexible electrode layer, the first flexible electrode layer comprising a first electrode array;
    providing a first spacer layer, and placing the first spacer layer on the first flexible electrode layer;
    providing a dielectric layer, and placing the dielectric layer on the first spacer layer;
    providing a second spacer layer, and placing the second spacer layer on the dielectric layer;
    providing a second flexible electrode layer, the second flexible electrode layer comprising a second electrode array;
    placing the second flexible electrode layer on the second spacer layer; and
    encapsulating the first flexible electrode layer, the first spacer layer, the dielectric layer, the second spacer layer, and the second flexible electrode layer into the flexible capacitor array,
    each electrode pair arranged opposite in the first electrode array and the second electrode array, and portions of the first spacer layer and the dielectric layer between the electrode pair forming a unit capacitor of the flexible capacitor array, the unit capacitor comprising a first double electric layer capacitor, the first double electric layer capacitor comprising the first electrode, the first spacer layer, and the dielectric layer; and in a pressed state, the dielectric layer in the unit capacitor passing through the first spacer layer to come into contact with the first electrode to form at least one first contact surface, a first micro double electric layer capacitor being formed at each of the at least one contact surface, and at least one first micro double electric layer capacitor at the at least one contact surface being connected in parallel to form the first double electric layer capacitor.

11. The preparation method according to claim 10, wherein a plurality of first electrodes in the first electrode array are arranged into a matrix comprising M rows and N columns, M and N being positive integers; and a plurality of second electrodes in the second electrode array are arranged into a matrix comprising M rows and N columns, and the second electrode in an $i^{th}$ row and an $j^{th}$ column in the second electrode array and the first electrode in an $i^{th}$ row and an $j^{th}$ column in the first electrode array are arranged opposite, to form the electrode pair, i being greater than or equal to 0 and being less than M, and j being greater than or equal to 0 and being less than N.

12. The preparation method according to claim 10, wherein the preparation method further comprises:
dissolving polyvinyl alcohol in water to form a gel-like solution;
adding phosphoric acid to the gel-like solution to form a mixed solution;
placing the mixed solution on a microstructure template; and
solidifying the mixed solution to obtain the dielectric layer.

13. A capacitor array detection system, comprising:
a flexible capacitor array comprising:
a first flexible electrode layer, the first flexible electrode layer comprising a first electrode array;
a second flexible electrode layer, the second flexible electrode layer comprising a second electrode array;
a dielectric layer, the dielectric layer being arranged between the first flexible electrode layer and the second flexible electrode layer;
a first spacer layer, the first spacer layer being arranged between the first electrode array and the dielectric layer; and
a second spacer layer, the second spacer layer being arranged between the second flexible electrode layer and the dielectric layer, the dielectric layer arranged between the first spacer layer and the second spacer layer,
each electrode pair arranged opposite in the first electrode array and the second electrode array, and portions of the first spacer layer and the dielectric layer between the electrode pair forming a unit capacitor of the flexible capacitor array, the unit capacitor comprising a first double electric layer capacitor, and the first double electric layer capacitor comprising the first electrode, the first spacer layer, and the dielectric layer; and
in a pressed state, the dielectric layer in the unit capacitor passing through the first spacer layer to come into contact with the first electrode to form at least one first contact surface, a first micro double electric layer capacitor being formed at each of the at least one contact surface, and at least one first micro double electric layer capacitor at the at least one contact surface being connected in parallel to form the first double electric layer capacitor;
a capacitor selection circuit, configured to gate at least one unit capacitor in the flexible capacitor array;
an excitation circuit, configured to output an excitation signal to the first electrode array of the flexible capacitor array and the second electrode array of the flexible capacitor array under control of the capacitor selection circuit; and
a capacitor detection circuit, configured to detect a capacitor value of the at least one unit capacitor.

14. The capacitor array detection system according to claim 13, wherein the capacitor detection circuit further comprises:
a crosstalk compensation circuit, configured to control, under the control of the capacitor selection circuit, the capacitor detection circuit to detect at least one crosstalk compensation value of the at least one unit capacitor; and
a capacitor calculation circuit, configured to update the capacitor value of the at least one unit capacitor based on the at least one crosstalk compensation value.

15. The capacitor array detection system according to claim 14, wherein
the flexible capacitor array is arranged on a pressure sensing detection surface, and each unit capacitor in the flexible capacitor array corresponds to a pressure sensing detection position of the pressure sensing detection surface;
the capacitor selection circuit is configured to gate each unit capacitor in the flexible capacitor array in sequence; and
the capacitor detection circuit is configured to: for each unit capacitor,
detect a capacitor value of the unit capacitor, and use the crosstalk compensation circuit to control the capacitor detection circuit to detect at least one crosstalk compensation value of the unit capacitor;
use the capacitor calculation circuit to update the capacitor value of the unit capacitor based on the at least one crosstalk compensation value; and
output the capacitor value of the each unit capacitor as pressure sensing information of the pressure sensing detection position in sequence.

16. The capacitor array detection system according to claim 13, wherein each first electrode in the first electrode array has a separate lead wire, and each second electrode in the second electrode array has a separate lead wire.

17. The capacitor array detection system according to claim 16, wherein the excitation circuit is configured to output an excitation signal to at least one lead wire in the first electrode array of the flexible capacitor array and at least one lead wire in the second electrode array of the flexible capacitor array under control of the capacitor selection circuit.

18. The capacitor array detection system according to claim 13, wherein
the unit capacitor further comprises a second double electric layer capacitor connected in series to the first double electric layer capacitor, and the second double electric layer capacitor comprises the second electrode, the second spacer layer, and the dielectric layer,
in a pressed state, the dielectric layer in the unit capacitor passing through the second spacer layer to come into contact with the second electrode to form at least one second contact surface, a second micro double electric layer capacitor being formed at each of the at least one contact surface, and at least one second micro double electric layer capacitor at the at least one contact surface being connected in parallel to form the second double electric layer capacitor.

19. A robot, comprising:

a capacitor array detection system comprising:

a flexible capacitor array being arranged on at least one portion of a pressure sensing detection surface of the robot, comprising:

a first flexible electrode layer, the first flexible electrode layer comprising a first electrode array;

a second flexible electrode layer, the second flexible electrode layer comprising a second electrode array;

a dielectric layer, the dielectric layer being arranged between the first flexible electrode layer and the second flexible electrode layer; and a first spacer layer, the first spacer layer being arranged between the first electrode array and the dielectric layer, each electrode pair arranged opposite in the first electrode array and the second electrode array, and portions of the first spacer layer and the dielectric layer between the electrode pair forming a unit capacitor of the flexible capacitor array, the unit capacitor comprising a first double electric layer capacitor, and the first double electric layer capacitor comprising the first electrode, the first spacer layer, and the dielectric layer; and in a pressed state, the dielectric layer in the unit capacitor passing through the first spacer layer to come into contact with the first electrode to form at least one first contact surface, a first micro double electric layer capacitor being formed at each of the at least one contact surface, and at least one first micro double electric layer capacitor at the at least one contact surface being connected in parallel to form the first double electric layer capacitor;

a capacitor selection circuit, configured to gate at least one unit capacitor in the flexible capacitor array;

an excitation circuit, configured to output an excitation signal to the first electrode array of the flexible capacitor array and the second electrode array of the flexible capacitor array under control of the capacitor selection circuit; and a capacitor detection circuit, configured to detect a capacitor value of the at least one unit capacitor, an impact force detector, configured to calculate an impact force detection value and an impact force occurrence position based on the capacitor value of the at least one unit capacitor detected by the capacitor array detection system;

an impact disturbance determiner, configured to determine an impact disturbance based on the impact force detection value and the impact force occurrence position calculated by the impact force detector; and an anti-impact disturbance controller, configured to, in response to the determined impact disturbance, adjust an operation parameter of the robot and control the robot to resist the impact disturbance.

20. The robot according to claim 19, wherein the robot is a quadruped robot, and the flexible capacitor array is laid in a pressure sensing detection surface of a sole of a foot of the quadruped robot;

the adjusting an operation parameter of the robot comprises: adjusting a foothold or a footing angle of the quadruped robot;

the anti-impact disturbance controller further comprises: a trajectory planning generator, a trajectory adjustment generator, and a foot joint angle generator, wherein the trajectory planning generator is configured to plan a centroid trajectory and a foothold trajectory of the quadruped robot;

the trajectory adjustment generator is configured to adjust the centroid trajectory of the quadruped robot based on the centroid trajectory of the quadruped robot and the impact detection value; and adjust the foothold trajectory of the quadruped robot based on the foothold trajectory of the quadruped robot; and the foot joint angle generator is configured to adjust, based on the adjusted centroid trajectory and the adjusted foothold trajectory, the foothold or the footing angle of the quadruped robot by adjusting a foot joint angle of the quadruped robot.

* * * * *